US012581816B2

(12) United States Patent
Wang et al.

(10) Patent No.: US 12,581,816 B2
(45) Date of Patent: Mar. 17, 2026

(54) DISPLAY SUBSTRATE AND DISPLAY APPARATUS WITH FANOUT LADDER SUB-LINES

(71) Applicants: Chengdu BOE Optoelectronics Technology Co., Ltd., Sichuan (CN); BOE Technology Group Co., Ltd., Beijing (CN)

(72) Inventors: Mengqi Wang, Beijing (CN); Ziyang Yu, Beijing (CN); Zhiliang Jiang, Beijing (CN); Ming Hu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 426 days.

(21) Appl. No.: 18/029,381

(22) PCT Filed: Apr. 19, 2022

(86) PCT No.: PCT/CN2022/087748
§ 371 (c)(1),
(2) Date: Mar. 30, 2023

(87) PCT Pub. No.: WO2023/201536
PCT Pub. Date: Oct. 26, 2023

(65) Prior Publication Data
US 2024/0365611 A1     Oct. 31, 2024

(51) Int. Cl.
*H10K 59/131*      (2023.01)
(52) U.S. Cl.
CPC ................................. *H10K 59/131* (2023.02)

(58) Field of Classification Search
CPC .................................................. H10K 59/131
See application file for complete search history.

(56)                References Cited

U.S. PATENT DOCUMENTS

2018/0204895 A1*  7/2018  Lin ...................... H10K 59/122
2020/0388230 A1*  12/2020  Lee ...................... G09G 3/3275
(Continued)

FOREIGN PATENT DOCUMENTS

CN         101673003 A      3/2010
CN         102981326 A      3/2013
(Continued)

*Primary Examiner* — Lex H Malsawma
(74) *Attorney, Agent, or Firm* — Ling Wu; Stephen Yang; Ling and Yang Intellectual Property

(57)                ABSTRACT

A display substrate, a preparing method therefor, and a display apparatus are disclosed. The display substrate includes multiple data signal lines (60) and multiple data fanout lines (70) disposed along a first direction (X). A data signal line (60) extends in a second direction (Y). A first terminal of the data fanout line (70) is connected to a lead line (90). A second terminal of the data fanout line (70) is connected to the data signal line (60). At least one data fanout line (70) includes multiple fanout step sub-lines connected sequentially, the at least one fanout step sub-line at least includes a first fanout line (71) and a second fanout line (72) connected to each other. The first fanout line (71) has a line shape extending along a first direction (X) and the second fanout line (72) has a line shape extending along a second direction (Y).

19 Claims, 18 Drawing Sheets

(56)                   References Cited

U.S. PATENT DOCUMENTS

| | | |
|---|---|---|
| 2020/0388665 A1 | 12/2020 | Jung et al. |
| 2021/0257435 A1 | 8/2021 | Kim et al. |
| 2021/0351259 A1* | 11/2021 | Lee ...................... H10K 59/131 |
| 2022/0384558 A1 | 12/2022 | Xu et al. |

FOREIGN PATENT DOCUMENTS

| | | |
|---|---|---|
| CN | 106292095 A | 1/2017 |
| CN | 109541865 A | 3/2019 |
| CN | 111653603 A | 9/2020 |
| CN | 113327516 A | 8/2021 |
| CN | 113345931 A | 9/2021 |
| CN | 113870713 A | 12/2021 |

* cited by examiner

DISPLAY SUBSTRATE AND DISPLAY APPARATUS WITH FANOUT LADDER SUB-LINES

CROSS-REFERENCE TO RELATED APPLICATIONS

The present application is a U.S. National Phase Entry of International Application PCT/CN2022/087748 having an international filing date of Apr. 19, 2022, and the contents disclosed in the above-mentioned application are hereby incorporated as a part of this application.

TECHNICAL FIELD

The present disclosure relates to, but is not limited to, the field of display technologies, and particularly to a display substrate, a preparation method therefor, and a display apparatus.

BACKGROUND

An Organic Light Emitting Diode (OLED for short) and a Quantum-dot Light Emitting Diode (QLED for short) are active light emitting display devices and have advantages such as self-luminescence, wide viewing angle, high contrast ratio, low power consumption, very high response speed, lightness and thinness, flexibility, and low costs. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate, which includes a display region and a bonding region, the display region is provided with multiple data signal lines and multiple data fanout lines arranged along a first direction, the data signal lines extend along a second direction, the bonding region is located on a side of the second direction of the display region, and is provided with multiple lead lines, wherein the first direction and the second direction intersect; a first terminal of the data fanout line is connected with the lead line, a second terminal of the data fanout line is connected with the data signal line, at least one data fanout line includes multiple fanout step sub-lines connected in sequence, at least one fanout step sub-line at least includes a first fanout line and a second fanout line connected with each other, wherein the first fanout line has a line shape extending along the first direction or the opposite direction of the first direction, and the second fanout line has a line shape extending along the second direction.

In an exemplary embodiment, in at least one fanout step sub-line, a first terminal of the first fanout line is connected with the adjacent fanout step sub-line in the opposite direction of the second direction, after a second terminal of the first fanout line extends along the first direction or the opposite direction of the first direction, it is connected with a first terminal of the second fanout line, after the second terminal of the second fanout line extends along the second direction, it is connected with the first terminal of the first fanout line in the adjacent fanout step sub-lines in the second direction.

In an exemplary embodiment, at least one fanout step sub-line further includes a third fanout line, a first terminal of the third fanout line is connected with the adjacent fanout step sub-line in the opposite direction of the second direction, after a second terminal of the third fanout line extends along the third direction, it is connected with the first terminal of the first fanout line, after the second terminal of the first fanout line extends along the first direction or the opposite direction of the first direction, it is connected with the first terminal of the second fanout line, after the second terminal of the second fanout line extends along the second direction, it is connected with the first terminal of the third fanout line in the adjacent fanout step sub-lines in the second direction; there is a first included angle between the third direction and the first direction, and the first included angle is greater than 0° and less than 90°.

In an exemplary embodiment, at least a fanout step sub-line further includes a fourth fanout line, the first terminal of the first fanout line is connected to the adjacent fanout step sub-line in the opposite direction to the second direction, after the second terminal of the first fanout line extends along the first direction or the opposite direction of the first direction, it is connected to a first terminal of the fourth fanout line, after a second terminal of the fourth fanout line extends along a fourth direction, it is connected to the first terminal of the second fanout line, after the second terminal of the second fanout line extends along the second direction, it is connected to the first terminal of the first fanout line in the adjacent fanout step sub-lines in the second direction; there is a second included angle between the fourth direction and the first direction, and the second included angle is greater than 0° and less than 90°.

In an exemplary embodiment, at least one fanout step sub-line further includes a third fanout line and a fourth fanout line, a first terminal of the third fanout line is connected with the adjacent fanout step sub-line in the opposite direction of the second direction, after a second terminal of the third fanout line extends along the third direction, it is connected to the first terminal of the first fanout line, after the second terminal of the first fanout line extends along the first direction or the opposite direction of the first direction, it is connected to a first terminal of the fourth fanout line, after the second terminal of the fourth fanout line extends along a fourth direction, it is connected to the first terminal of the second fanout line, after the second terminal of the second fanout line extends along the second direction, it is connected to the first terminal of the third fanout line in the adjacent fanout step sub-lines in the second direction; there is a first included angle between the third direction and the first direction, and the first included angle is greater than 0° and less than 90°, there is a second included angle between the fourth direction and the first direction, and the second included angle is greater than 0° and less than 90°.

In an exemplary embodiment, the first included angle is 30° to 60°, and the second included angle is 30° to 60°.

In an exemplary embodiment, two second fanout lines are provided between adjacent data signal lines in the first direction.

In an exemplary embodiment, the data fanout line is connected with the data signal line through an overlap via, the orthographic projection of multiple overlap vias on the display substrate plane at least partially overlaps with the orthographic projection of a first overlap via line on the display substrate plane, there is an overlap included angle between the first overlap via line and the first direction, and the overlap included angle is greater than 0° and less than 90°.

In an exemplary embodiment, one second fanout line is provided between adjacent data signal lines in the first direction.

In an exemplary embodiment, the data fanout line is connected to the data signal line through an overlap via, the orthographic projections of multiple overlap vias on the base substrate at least partially overlap with the orthographic projection of a second overlap via line on the base substrate, and the second overlap via line is a straight line extending along the first direction.

In an exemplary embodiment, the orthographic projection of the second fanout line on the display substrate plane and the orthographic projection of the data signal line on the display substrate plane do not overlap.

In an exemplary embodiment, the display region is further provided with an initial signal line extending along the first direction, and an orthographic projection of the first fanout line on the display substrate plane at least partially overlaps with an orthographic projection of the initial signal line on the display substrate plane.

In an exemplary embodiment, the display region is further provided with multiple dummy lines, and the step-like routing of the dummy lines and the step-like routing of the data fanout lines may be substantially the same.

In an exemplary embodiment, the display region at least includes a first region and a second region, wherein the first region is provided with the data fanout line, the second region is provided with the dummy line, and at least one dummy line includes multiple dummy step sub-lines connected sequentially.

In an exemplary embodiment, the first region includes multiple first circuit units, at least one first circuit unit is provided with a fanout step sub-line, the second region includes multiple second circuit units, at least one second circuit unit is provided with a dummy step sub-line, and the position and shape of the fanout step sub-line in the first circuit unit is substantially the same as the position of the dummy step sub-line in the second circuit unit.

In an exemplary embodiment, at least one first circuit unit is provided with an overlap via through which the data fanout line is connected to the data signal line.

In an exemplary embodiment, at least one second circuit unit is provided with a break, which is configured to isolate the data fanout line from the dummy line.

In an exemplary embodiment, at least one first circuit unit is provided with a fanout connection block, and the at least one fanout connection block is configured to be connected to the data signal line through an overlap via.

In an exemplary embodiment, at least one second circuit unit is provided with a dummy connection block, and the position and shape of the dummy connection block in the second circuit unit are substantially the same as the position and shape of the fanout connection block in the first circuit unit.

In an exemplary embodiment, the display substrate further includes a bezel region located on other sides of the display region, the bezel region at least includes a bezel power supply lead line, the fanout line is connected with the bezel power supply lead line, and the bezel power supply lead line is configured to transmit high-voltage power supply signals or low-voltage power supply signals.

In an exemplary embodiment, the data fanout line and the dummy line are arranged on the same layer.

In another aspect, the present disclosure further provides a display apparatus, including the aforementioned display substrate.

In another aspect, the present disclosure further provides a method for preparing a display substrate, the display substrate includes a display region and a bonding region, the display region is provided with multiple data signal lines and multiple data fanout lines arranged along a first direction, the data signal lines extend along a second direction, the bonding region is located on a side of the second direction of the display region, and is provided with multiple lead lines, wherein the first direction and the second direction intersect; the preparation method includes:

forming the data signal line, the data fanout line and the lead line; a first terminal of the data fanout line is connected with the lead line, a second terminal of the data fanout line is connected with the data signal line, at least one data fanout line includes multiple fanout step sub-lines connected in sequence, at least one fanout step sub-line at least includes a first fanout line and a second fanout line connected with each other, wherein the first fanout line has a line shape extending along the first direction or the opposite direction of the first direction, and the second fanout line has a line shape extending along the second direction.

Other aspects may be understood upon reading and understanding the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

Figure 1:
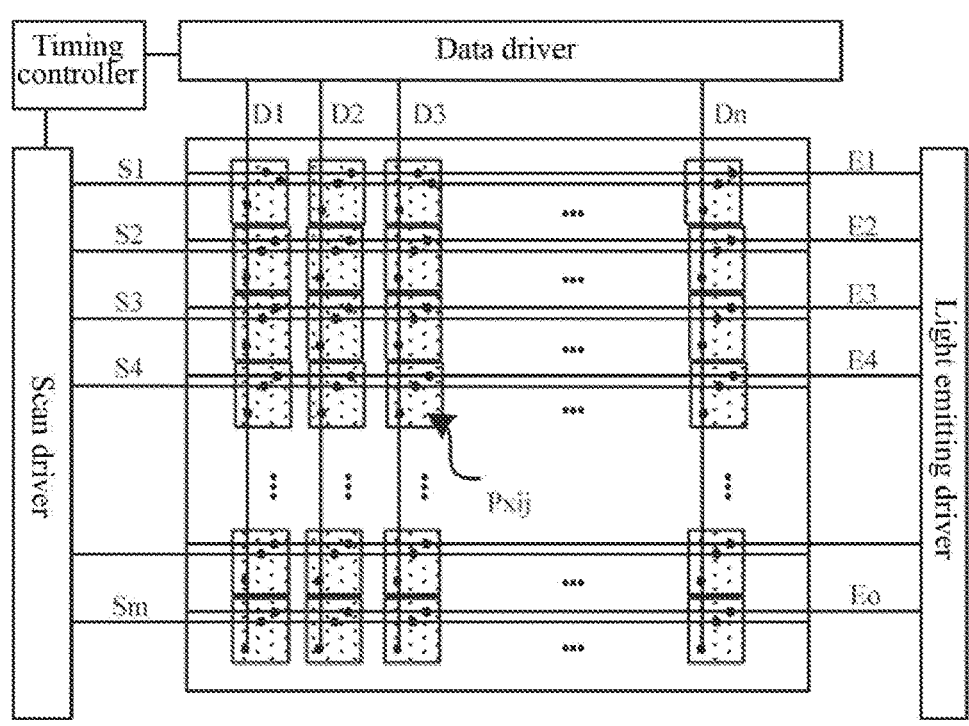
FIG. 1 is a schematic diagram of a structure of a display apparatus.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made

| Description of reference signs: | | |
|---|---|---|
| 11-first active layer; | 12-second active layer; | 13-third active layer; |
| 14-fourth active layer; | 15-fifth active layer; | 16-sixth active layer; |
| 17-seventh active layer; | 21-first scan signal line; | 22-second scan signal line |
| 23-light emitting control line; | 24-first electrode plate; | 31-initial signal line; |
| 32-second electrode plate; | 33-electrode plate connection line; | 34-shield electrode; |
| 35-opening; | 41-first connection electrode; | 42-second connection electrode; |
| 43-third connection electrode; | 44-first power supply line; | 51-anode connection electrode; |
| 60-data signal line; | 61-data connection block; | 70-data fanout line; |
| 71-first data fanout line; | 72-second data fanout line; | 73-third data fanout line; |
| 74-fourth data fanout line; | 75-fanout connection block; | 80-dummy line; |
| 81-first dummy line; | 82-second dummy line; | 83-third dummy line; |
| 84-fourth dummy line; | 85-dummy connection block; | 90-lead line; |
| 100-display region; | 101-base substrate; | 102-drive circuit layer; |
| 103-light emitting structure layer; | 104-encapsulation structure layer; | 110-first region; |
| 120-second region; | 200-bonding region; | 201-lead line region; |
| 202-bending region; | 300-bezel region; | 301-anode; |
| 302-pixel define layer; | 303-organic light emitting layer; | 304-cathode; |
| 401-first encapsulation layer; | 402-second encapsulation layer; | 403-third encapsulation layer. |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each film layer, and the width and spacing of each signal line may be adjusted according to actual needs. The number of pixels in the display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

according to situations without being limited to the wordings described in the specification.

In the specification, unless otherwise specified and defined explicitly, terms "mount", "mutually connect", and "connect" should be understood in a broad sense. It may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 800 and below 100°, and thus also includes a state in which the angle is above 850 and below 95°.

In the specification, a "film" and a "layer" are interchangeable. For example, a "conductive layer" may be replaced with a "conductive film" sometimes. Similarly, an "insulation film" may be replaced with an "insulating layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc. In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver, respectively, the data driver is connected to multiple data signal lines (D1 to Dn) respectively, the scan driver is connected to multiple scan signal lines (S1 to Sm) respectively, and the light emitting driver is connected to multiple light emitting signal lines (E1 to Eo) respectively. The pixel array may include multiple sub-pixels Pxij, i and j may be natural numbers. At least one sub-pixel Pxij may include a circuit unit and a light-emitting device connected to the circuit unit. The circuit unit may at least include a pixel drive circuit connected to a scan signal line, a data signal line and a light-emitting signal line. In an exemplary embodiment, the timing controller may provide a gray tone value and a control signal, which are suitable for a specification of the data driver, to the data driver, provide a clock signal, a scan start signal, etc., which are suitable for a specification of the scan driver, to the scan driver, and provide a clock signal, a transmit stop signal, etc., which are suitable for a specification of the light emitting driver, to the light emitting driver. The data driver may generate data voltages to be provided to data signal lines D1, D2, D3, . . . , and Dn using the gray scale value and the control signal received from the timing controller. For example, the data driver may sample the gray tone value by using the clock signal and apply a data voltage corresponding to the gray tone value to the data signal lines D1 to Dn by taking a pixel row as a unit, wherein n may be a natural number. The scan driver may generate scan signals to be provided to scan signal lines S1, S2, S3, . . . , and Sm by receiving a clock signal, a scanning start signal, and the like from the timing controller. For example, the scan driver may provide a scan signal with an on-level pulse to the scan signal lines S1 to Sm sequentially. For example, the scan driver may be constructed in a form of a shift register and may generate a scan signal in a manner in which the scan start signal provided in a form of an on-level pulse is transmitted to a next-stage circuit sequentially under the control of the clock signal, wherein m may be a natural number. The light-emitting driver may generate transmission signals to be provided to light-emitting line emitting lines E1, E2, E3, . . . , and Eo by receiving the clock signal, the transmission stop signal, and the like from the timing controller. For example, the light emitting driver may provide a transmit signal with an off-level pulse to the light emitting signal lines E1 to Eo sequentially. For example, the light emitting driver may be constructed in a form of a shift register and may generate a transmit signal in a manner in which the transmit stop signal provided in a form of an off-level pulse is transmitted to a next-stage circuit sequentially under the control of the clock signal, wherein o may be a natural number.

Figure 2:
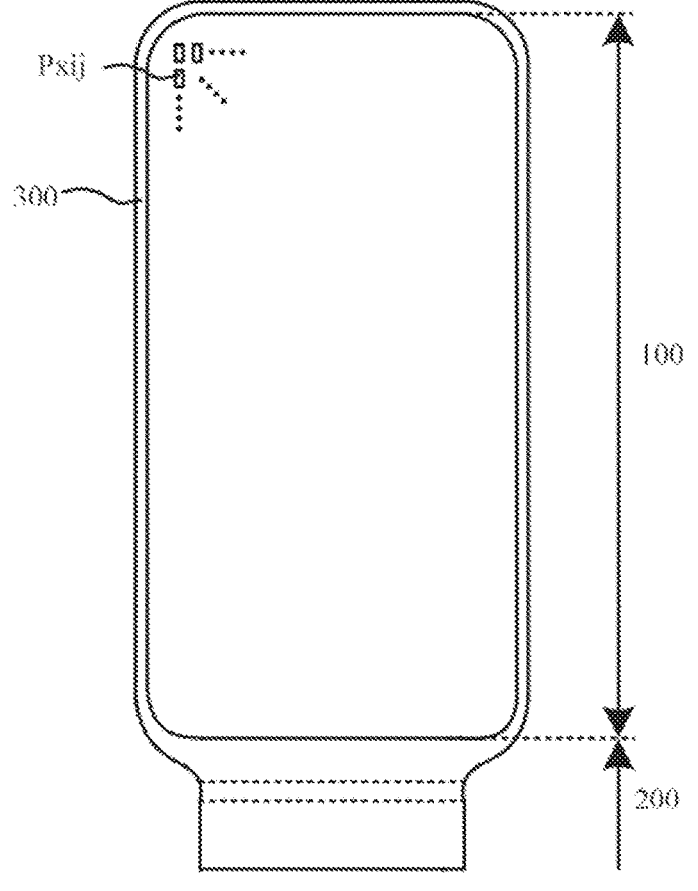
FIG. 2 is a schematic diagram of a structure of a display substrate.

FIG. 2 is a schematic diagram of a structure of a display substrate. As shown in FIG. 2, the display substrate may include a display region 100, a bonding region 200 at a side of the display region 100, and a bezel region 300 at other sides of the display region 100. In an exemplary embodiment, the display region 100 may be a planar region including multiple sub-pixels Pxij that constitute a pixel array, the multiple sub-pixels Pxij are configured to display a dynamic picture or a static image, and the display region 100 may be referred to as an active area (AA). In an exemplary embodiment, the display substrate may be deformable, e.g., may be crimped, bent, folded, or curled.

In an exemplary embodiment, a bonding region 200 may include a fanout region, a bending region, a drive chip region, and a bonding pin region that are disposed sequentially along a direction away from the display region 100. The fanout region is connected to the display region 100 and may at least include multiple data fanout lines configured to connect data signal lines of the display region in a Fanout routing manner. The bend region is connected to the fanout region and may include a composite insulating layer provided with a groove, and is configured to bend the bonding region to the back of the display region. The drive chip region may include an Integrated Circuit (IC for short) and is configured to be connected with the multiple data fanout lines. The bonding pin region may at least include multiple bonding pads, and is configured to be bonded to and connected with an external Flexible Printed Circuit (FPC for short).

In an exemplary embodiment, the bezel region 300 may include a circuit region, a power supply line region, and a crack dam region and a cutting region which are sequentially disposed along the direction away from the display region 100. The circuit region is connected to the display region 100 and may at least include a gate drive circuit which is connected with a first scan line, a second scan line and a light emitting control line of a pixel drive circuit in the display region 100. The power supply line region is connected to the circuit region and may at least include a bezel power supply lead line that extends along a direction parallel to the edge of the display region and is connected with a cathode in the display region 100. The crack dam region is connected to the power supply line region and may at least include multiple cracks disposed on the composite insulating layer. The cutting region is connected to the crack dam region and may at least include a cutting groove disposed on the composite insulating layer, and the cutting groove is used for cutting respectively along the cutting groove by a cutting device after all film layers of the display substrate are prepared.

In an exemplary embodiment, the fanout region in the bonding region 200 and the power supply line region in the bezel region 300 may be provided with a first isolation dam and a second isolation dam, the first isolation dam and the second isolation dam may extend in a direction parallel to the edge of the display region 100, thus forming an annular structure surrounding the display region 100, wherein the edge of the display region is an edge at a side of the display region, the bonding region or the bezel region.

Figure 3:
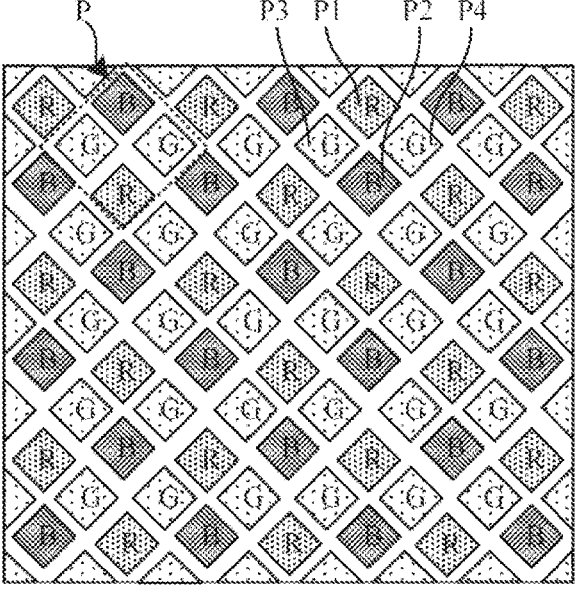
FIG. 3 is a schematic diagram of a planar structure of a display region in a display substrate.

FIG. 3 is a schematic diagram of a planar structure of a display region in a display substrate. As shown in FIG. 3, the display substrate may include multiple pixel units P arranged in a matrix. At least one pixel unit P includes a first sub-pixel P1 emitting light of a first color, a second sub-pixel P2 emitting light of a second color, a third sub-pixel P3 emitting light of a third color and a fourth sub-pixel P4 emitting light of a fourth color. Each circuit unit may include a circuit unit and a light emitting device. The pixel drive circuit may at least include a pixel drive circuit which is connected with a scan signal line, a data signal line, and a light emitting signal line respectively. The pixel drive circuit is configured to receive a data voltage transmitted by the data signal line and output a corresponding current to the light emitting device under control of the scan signal line and the light emitting signal line. The light emitting device in each circuit unit is connected with a pixel drive circuit of a sub-pixel where the light emitting device is located, and is configured to emit light with a corresponding brightness in response to a current output by the pixel drive circuit of the sub-pixel where the light emitting device is located.

In an exemplary embodiment, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary embodiment, the shape of the sub-pixel may be rectangle, diamond, pentagonal, hexagonal. The four sub-pixels may be arranged in a manner of diamond to form an RGBG pixel arrangement. In other exemplary embodiments, the four sub-pixels may be arranged in a manner of horizontal juxtaposition, vertical juxtaposition, or square and so on, which is not limited in the present disclosure.

In an exemplary embodiment, the pixel unit may include three sub-pixels, the three sub-pixels may be arranged in manner of horizontal juxtaposition, vertical juxtaposition or triangle, which is not limited in the present disclosure.

Figure 4:
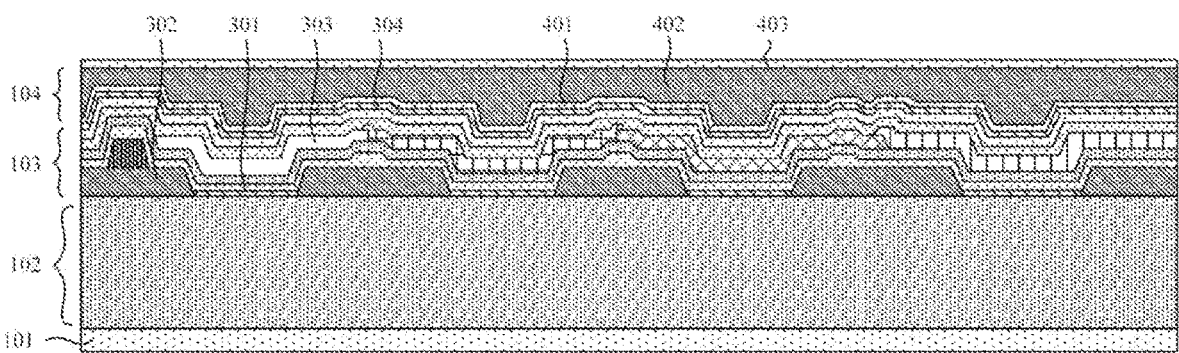
FIG. 4 is a schematic diagram of a sectional structure of a display region in a display substrate.

FIG. 4 is a schematic diagram of a sectional structure of a display region in a display substrate, illustrating a structure of four sub-pixels in the display region. As shown in FIG. 4, in a plane perpendicular to the display substrate, the display substrate may include a drive circuit layer 102 disposed on a base substrate 101, a light emitting structure layer 103 disposed at a side of the drive circuit layer 102 away from the base substrate 101, and an encapsulation structure layer 104 disposed at a side of the light emitting structure layer 103 away from the base substrate 101. In some possible implementations, the display substrate may include other film layers, such as a touch structure layer, which is not limited here in the present disclosure.

In an exemplary embodiment, the base substrate 101 may be a flexible base substrate, or a rigid base substrate. The drive circuit layer 102 may include multiple circuit units, which may at least include a pixel drive circuit. The light emitting structure layer 103 may include multiple sub-pixels, each of which may include a light emitting device and a pixel define layer 302. The light emitting device may include an anode 301, an organic light emitting layer 303 and a cathode 304, the organic light emitting layer 303 is disposed between the anode 301 and the cathode 304, and the organic light emitting layer 303 emits light rays of corresponding colors under the drive by the anode 301 and the cathode 304. The encapsulation structure layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, thus ensuring that external water vapor cannot enter the light emitting structure layer 103.

In an exemplary embodiment, the organic light emitting layer may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In an exemplary embodiment, one or more layers of hole injection layers, hole transport layers, electron block layers, hole block layers, electron transport layers, and electron injection layers of all sub-pixels may be a common layer communicated together. Emitting layers of adjacent sub-pixels may be overlapped slightly, or may be mutually isolated.

Figure 5:
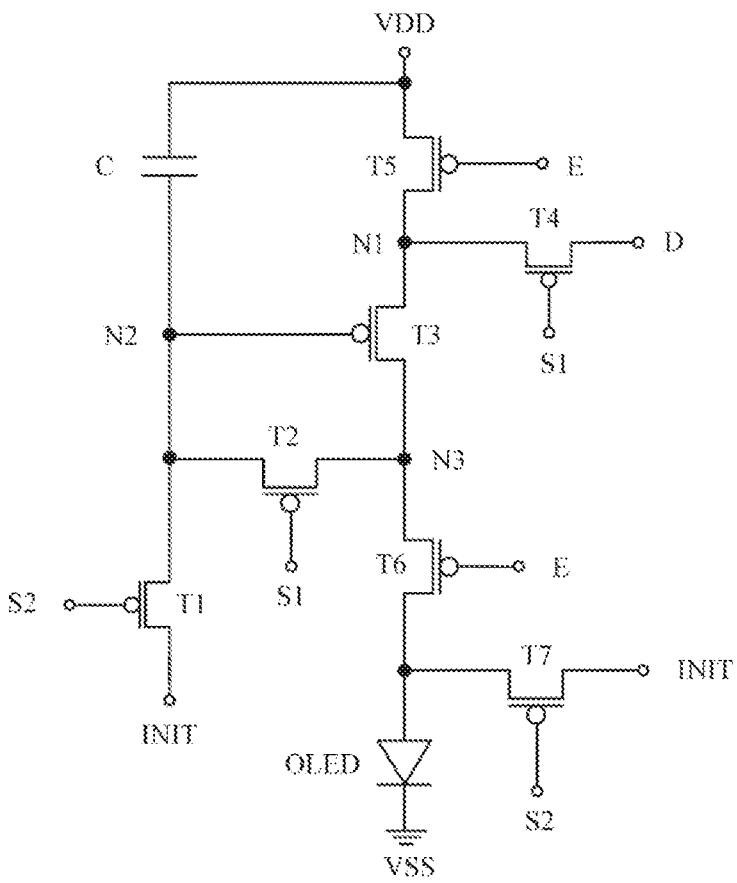
FIG. 5 is a schematic diagram of an equivalent circuit of a pixel drive circuit.

FIG. 5 is a schematic diagram of an equivalent circuit of a pixel drive circuit. In an exemplary embodiment, the pixel drive circuit may have a structure of 3T1C, 4T1C, 5T1C, 5T2C, 6T1C, 7T1C or 8T1C. As shown in FIG. 5, the pixel drive circuit may include seven transistors (a first transistor T1 to a seventh transistor T7), one storage capacitor C. The pixel drive circuit is connected with seven signal lines (a data signal line D, a first scan signal line S1, a second scan signal line S2, a light emitting signal line E, an initial signal line INIT, a first power supply line VDD, and a second power supply line VSS) respectively.

In an exemplary embodiment, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second terminal of the storage capacitor C, and the third node N3 is respectively connected with a second electrode of the second transistor T2, a second electrode of the third transistor T3, and a first electrode of the sixth transistor T6.

In an exemplary embodiment, a first terminal of the storage capacitor C is connected with the first power supply line VDD, and the second terminal of the storage capacitor C is connected with the second node N2, i.e., the second terminal of the storage capacitor C is connected with the control electrode of the third transistor T3.

A control electrode of the first transistor T1 is connected with the second scan signal line S2, a first electrode of the first transistor T1 is connected with an initial signal line INIT, and the second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with a second electrode of the third transistor T3.

The control electrode of the third transistor T3 is connected with the second node N2, i.e., the control electrode of the third transistor T3 is connected with the second terminal of the storage capacitor C, a first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the second scan signal line S2, a first electrode of the seventh transistor T7 is connected with the initial signal line INIT, and a second electrode of the seventh transistor T7 is connected with the first electrode of the light emitting device. When a scan signal with an on-level is applied to the second scan signal line S2, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary embodiment, the light emitting device may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary embodiment, a second electrode of the light emitting device is connected with the second power supply line VSS, a signal of the second power supply line VSS is a low-level signal continuously provided, and a signal of the first power supply line VDD is a high-level signal continuously provided.

In an exemplary embodiment, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In an exemplary embodiment, the first transistor T1 to the seventh transistor T7 may be low temperature poly silicon thin film transistors, or may be oxide thin film transistors, or may be low temperature poly silicon thin film transistors and oxide thin film transistors. An active layer of a low temperature poly silicon thin film transistor may be made of Low Temperature Poly Silicon (LTPS for short), and an active layer of an oxide thin film transistor may be made of an oxide semiconductor (Oxide). The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

Taking seven transistors as P-type transistors as an example, the working process of the pixel drive circuit may include:

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signals, which causes the first transistor T1 and the seventh transistor T7 to be turned on. The first transistor T1 is turned on such that the initial voltage of the initial signal line INIT is provided to a second node N2 to initialize the storage capacitor C to clear an original data voltage in the storage capacitor. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization. The signals of the first scan signal line S1 and the light emitting signal line E are high-level signals, so that the second transistor T2, the fourth transistor T4, the fifth transistor T5 and the sixth transistor T6 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line D outputs a data voltage. In this stage, a second terminal of the storage capacitor C is at a low level, so the third transistor T3 is turned on. The signal of the first scan signal line S1 is a low-level signal, so that the second transistor T2 and the fourth transistor T4 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second terminal (the second node N2) of the storage capacitor C is Vd−|Vth|, wherein Vd is the data voltage output by the data signal line D, and Vth is the threshold voltage of the third transistor T3. The signal of the second scan signal line S2 is the high-level signal, so that the first transistor T1 and the seventh transistor T7 are turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I=K^*(Vgs-Vth)^2=K^*[(Vdd-Vd+|Vth|)-Vth]^2=K^* [(Vdd-Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With the development of OLED display technologies, consumers have higher requirements for the display effect of display products. Super-narrow bezels have become a new trend in the development of display products. Therefore, bezel narrowing or even a bezel-less design has received more attention in the design of OLED display products. In a display substrate, the data fanout line is arranged in the fanout region of the bonding region. Because the width of the fanout region is smaller than the width of the display region, the data fanout line may be introduced into a wider display region through the fanout route. The larger the width difference between the display region and the bonding region, the more oblique fanout lines in the fanout region, the larger the space occupied by the fanout region, and the width of the lower bezel. In addition, with the increasing resolution of the display screen, the occupied width of the fanout line will gradually increase, which makes it difficult to narrow the lower bezel.

Exemplary embodiments of the present disclosure provide a display substrate employing a structure in which data fanout lines are located in a display region (Fanout in AA, abbreviated as FIAA). In an exemplary embodiment, on a plane parallel to the display substrate, the display substrate may include a display region and a bonding region, the display region is provided with multiple data signal lines and multiple data fanout lines arranged along a first direction, the data signal lines extend along a second direction, the bonding region is located on a side of the second direction of the display region, and is provided with multiple lead lines, wherein the first direction and the second direction intersect; a first terminal of the data fanout line is connected with the lead line, a second terminal of the data fanout line is connected with the data signal line, at least one data fanout line includes multiple fanout step sub-lines connected in sequence, at least one fanout step sub-line at least includes a first fanout line and a second fanout line connected with each other, wherein the first fanout line has a line shape extending along the first direction or the opposite direction of the first direction, and the second fanout line has a line shape extending along the second direction.

In an exemplary embodiment, in at least one fanout step sub-line, a first terminal of the first fanout line is connected with the adjacent fanout step sub-line in the opposite direction of the second direction, after a second terminal of the first fanout line extends along the first direction or the opposite direction of the first direction, it is connected with a first terminal of the second fanout line, after the second terminal of the second fanout line extends along the second direction, it is connected with the first terminal of the first fanout line in the fanout step sub-line adjacent in the second direction.

In another exemplary embodiment, at least one fanout step sub-line further includes a third fanout line, a first terminal of the third fanout line is connected with the adjacent fanout step sub-line in the opposite direction of the second direction, after a second terminal of the third fanout line extends along the third direction, it is connected with the first terminal of the first fanout line, after the second terminal of the first fanout line extends along the first direction or the opposite direction of the first direction, it is connected with the first terminal of the second fanout line, after the second terminal of the second fanout line extends along the second direction, it is connected with the first terminal of the third fanout line in the fanout step sub-line adjacent in the second direction; there is a first included angle between the third direction and the first direction, and the first included angle is greater than 0° and less than 90°.

In another exemplary embodiment, at least a fanout step sub-line further includes a fourth fanout line, the first terminal of the first fanout line is connected to the adjacent fanout step sub-line in the opposite direction to the second direction, after the second terminal of the first fanout line extends along the first direction or the opposite direction of the first direction, it is connected to a first terminal of the fourth fanout line, after a second terminal of the fourth fanout line extends along a fourth direction, it is connected to the first terminal of the second fanout line, after the second terminal of the second fanout line extends along the second direction, it is connected to the first terminal of the first fanout line in the fanout step sub-line adjacent in the second direction; there is a second included angle between the fourth direction and the first direction, and the second included angle is greater than 0° and less than 90°.

In another exemplary embodiment, at least one fanout step sub-line further includes a third fanout line and a fourth fanout line, a first terminal of the third fanout line is connected with the adjacent fanout step sub-line in the opposite direction of the second direction, after a second terminal of the third fanout line extends along the third direction, it is connected to the first terminal of the first fanout line, after the second terminal of the first fanout line extends along the first direction or the opposite direction of the first direction, it is connected to a first terminal of the fourth fanout line, after the second terminal of the fourth fanout line extends along a fourth direction, it is connected to the first terminal of the second fanout line, after the second terminal of the second fanout line extends along the second direction, it is connected to the first terminal of the third fanout line in the fanout step sub-line adjacent in the second direction; there is a first included angle between the third direction and the first direction, and the first included angle is greater than 0° and less than 90°, there is a second included angle between the fourth direction and the first direction, and the second included angle is greater than 0° and less than 90°.

In an exemplary embodiment, the first included angle may be about 30° to 60°, and the second included angle may be about 30° to 60°.

In an exemplary embodiment, the display region is further provided with multiple dummy lines, at least one dummy line includes multiple dummy step sub-lines connected sequentially, and at least one dummy step sub-line at least includes a first dummy line and a second dummy line connected to each other, the first dummy line extends along the first direction or an opposite direction of the first direction, and the second dummy line extends along the second direction.

In an exemplary embodiment, the step-like routing of the dummy lines and the step-like routing of the data fanout lines may be substantially the same.

In an exemplary embodiment, in the plane perpendicular to the display substrate, the display substrate may include a drive circuit layer provided on the base substrate, a light emitting structure layer provided on a side of the drive circuit layer away from the base substrate, and an encapsulation structure layer provided on a side of the light emitting structure layer away from the base substrate. In an exemplary embodiment, a drive circuit layer of a display region may include multiple circuit units forming multiple unit rows and multiple unit columns, and at least one circuit unit may include a pixel drive circuit configured to output a corresponding current to a connected light emitting device. The light emitting structure layer of the display region may include multiple sub-pixels forming a pixel array, at least one sub-pixel may include a light emitting device connected to a pixel drive circuit of a corresponding circuit unit, and the light emitting device is configured to emit light of a corresponding brightness in response to a current output by the connected pixel drive circuit.

Figure 6:
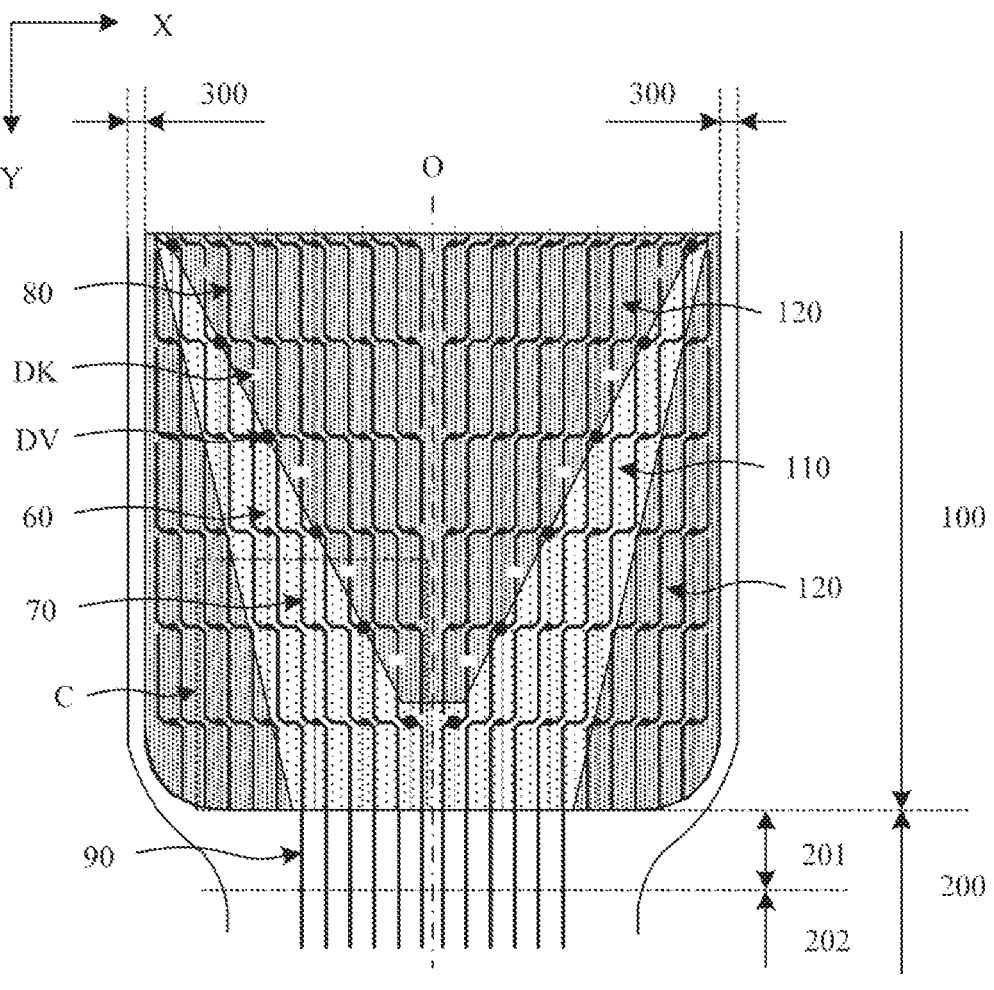
FIG. 6 is a schematic diagram of a planar structure of a display substrate according to an exemplary embodiment of the present disclosure.

In an exemplary embodiment, sub-pixels in the present disclosure refer to regions divided according to light emitting devices, and circuit units in the present disclosure refer to regions divided according to pixel drive circuits. In an exemplary embodiment, the position of the orthographic projection of the sub-pixel on the base substrate may correspond to the position of the orthographic projection of the circuit unit on the base substrate, or, the position of the orthographic projection of the sub-pixel on the base substrate may not correspond to the position of the orthographic projection of the circuit unit on the base substrate, FIG. 6 is a schematic diagram of a planar structure of a display substrate according to an exemplary embodiment of the present disclosure in which data fanout lines in the display substrate adopts a FIAA structure. In a plane parallel to the display substrate, the display substrate may include a display region 100, a bonding region 200 on a side of the display region 100 in the second direction Y, and a bezel region 300 on other sides of the display region 100. The display region 100 may at least include multiple circuit units, multiple data signal lines 60, multiple data fanout lines 70, and multiple dummy lines 80 forming multiple unit rows and multiple unit columns. The bonding region 200 may at least include a lead line region 201 and a bending region 202 that are sequentially disposed in a direction away from the display region 100 and the lead line region 201 may be provided with multiple leads 90.

In an exemplary embodiment, multiple circuit units sequentially arranged along a first direction X may be referred to as a unit row, and multiple circuit units sequentially arranged along a second direction Y may be referred to as a unit column. The multiple unit rows and the multiple unit columns form an array of circuit units arranged in an array, the first direction X intersects the second direction Y. In an exemplary embodiment, the second direction Y may be an extension direction of the data signal line (vertical direction) and the first direction X may be perpendicular to the second direction Y (horizontal direction).

In an exemplary embodiment, the data signal lines 60 may be in a line shape whose main body part extends along the second direction Y, and multiple data signal lines 60 are sequentially disposed with a predefined interval in the first direction X. The circuit units may at least include a pixel drive circuit, and each data signal line 60 is connected to the pixel drive circuits of multiple circuit units in a unit column.

In the present disclosure, "A extends in a B direction" means that A may include a main part, which is a line, a line segment or a strip-shaped body, and a secondary part connected with the main part, the main part extends in the B direction, and a length of the main part extending in the B direction is greater than a length of the secondary part extending in another direction. In the following description, "A extends in a B direction" means "the main body part of A extends in a B direction".

In an exemplary embodiment, the first direction X may be a direction pointing from the left side of the display region 100 to the right side of the display region 100, the opposite direction of the first direction X may be a direction pointing from the right side of the display region 100 to the left side of the display region 100, the second direction Y may be a direction pointing from the display region 100 to the bonding region 200, and the opposite direction of the second direction Y may be a direction pointing from the bonding region 200 to the display region 100.

In an exemplary embodiment, multiple lead lines 90 of a lead line region 201 are sequentially arranged at set intervals in a first direction X, the first terminals of the multiple lead lines 90 are connected to an integrated circuit in a bonding region, and the second terminals of the multiple lead lines 90 are connected to the first terminals of the multiple data fanout lines 70 after extending to the lead line region 201 through a bend region 202.

In an exemplary embodiment, the multiple lead lines 90 and the multiple data fanout lines 70 may be connected directly or may be connected through vias, and the present disclosure is not limited herein.

In an exemplary embodiment, multiple data fanout lines 70 in the display region 100 may be stepped, the first terminals of the multiple data fanout lines 70 are connected to the second terminals of the multiple lead lines 90 of the lead line region 201. After the second terminals of the multiple data fanout lines 70 extend in a step-like way in a direction away from the lead line region 201, the multiple data signal lines 60 are correspondingly connected through multiple overlap vias DV, so that the integrated circuit applies data signals to the data signal lines 60 through the lead lines 90 of the lead line region 201 and the data fanout lines 70 of the display region 100.

In an exemplary embodiment, at least one data fanout line 70 may include multiple fanout step sub-lines connected sequentially. At least one fanout step sub-line may include a first fanout line and a second fanout line connected to each other, the shape of the first fanout line may be a line shape extending along the first direction X or the opposite direction of the first direction X, and the shape of the second fanout line may be a line shape extending along the second direction Y.

In an exemplary embodiment, the multiple dummy lines 80 in the display region 100 may be stepped. At least one dummy line 80 may include multiple dummy step sub-lines connected sequentially. At least one dummy step sub-line may include a first dummy line and a second dummy line connected to each other, the shape of the first dummy line may be a line shape extending along the first direction X or the opposite direction of the first direction X, and the shape of the second dummy line may be a line shape extending along the second direction Y.

In an exemplary embodiment, the step-like routing of the multiple dummy lines 80 and the step-like routing of the multiple data fanout lines 70 may be substantially the same.

In the exemplary embodiment, since the data fanout line is provided in the display region, a fan-shaped diagonal line is not required to be provided in the bonding region, thereby reducing the width of the lead line region and effectively reducing the width of the lower border.

In an exemplary embodiment, the quantity of data fanout lines in the display region may be the same as the quantity of data signal lines, each of the data signal lines is correspondingly connected with one of the lead lines through one of the data fanout lines. Alternatively, the quantity of data fanout lines in the display region may be less than the quantity of data signal lines, and a part of the data signal lines in the display region are connected with the lead lines correspondingly through the data fanout lines, and the other part of the data signal lines are directly connected with the lead lines, which is not limited in the present disclosure.

In an exemplary embodiment, the display region 100 may be divided into a first region 110 and a second region 120 according to the setting positions of the data fanout line 80 and the dummy line 80 as the dividing basis, the first region 110 may be a region where the data fanout line 70 is provided and the second region 120 may be a region where the dummy line 80 is provided.

In an exemplary embodiment, the first region 110 may include multiple first circuit units, at least one of which is provided with a fanout step sub-line, and the positions and shapes of the fanout step sub-lines may be substantially the same among the multiple first circuit units.

In an exemplary embodiment, at least one first circuit unit is provided with an overlap via DV, through which the data fanout line 80 is connected to the data signal line 60.

In an exemplary embodiment, the second region 120 may include multiple second circuit units, at least one of which is provided with a dummy step sub-line, and the positions and shapes of the dummy step sub-lines in the multiple second circuit units may be substantially the same.

In an exemplary embodiment, the position and shape of the dummy step sub-line provided in the second circuit unit may be substantially the same as the position and shape of the fanout step sub-line provided in the first circuit unit.

In an exemplary embodiment, at least one second circuit unit is provided with a break DK that isolates a data fanout line 70 of the first circuit unit from a dummy line 80 of the second circuit unit, enabling insulation between the data fanout line 70 and the dummy line 80.

In an exemplary embodiment, the division of the first region and the second region of the present disclosure is merely an exemplary illustration. Since the first region 110 and the second region 120 are divided according to the data fanout line 80 and the dummy line 80, the shapes of the first region 110 and the second region 120 may be regular or irregular polygons. The display region may be divided into one or more first regions 110 and one or more second regions 120, which are not limited in this disclosure.

In an exemplary embodiment, the display region 100 may have a centerline O which may be a straight line bisecting multiple unit columns of the display region 100 and extending along a second direction Y. In an exemplary embodiment, the first region 110 and the second region 120 in the display region 100 may be symmetrically disposed with respect to the center line O, and the multiple data signal lines 60, the multiple data fanout lines 70, the multiple dummy lines 80 and the multiple lead lines 90 in the lead line region 201 in the display region 100 may be symmetrically disposed with respect to the center line O.

In an exemplary embodiment, on the left side of the center line O, a first fanout line in the fanout step sub-line is a line shape extending along the first direction X, and a first dummy line in the dummy step sub-line is a line shape extending along the first direction X. On the right side of the center line O, a first fanout line in the fanout step sub-line has a line shape extending in the opposite direction of the first direction X, and a first dummy line in the dummy step sub-line has a line shape extending in the opposite direction of the first direction X.

In an exemplary embodiment, the bezel region 300 may at least include a bezel power supply lead line (not shown), multiple fanout lines 80 may be connected to the bezel power supply lead line of the bezel region 300, and the bezel power supply lead line may be configured to transmit high voltage power supply signals or transmit low voltage power supply signals.

Figure 7A:
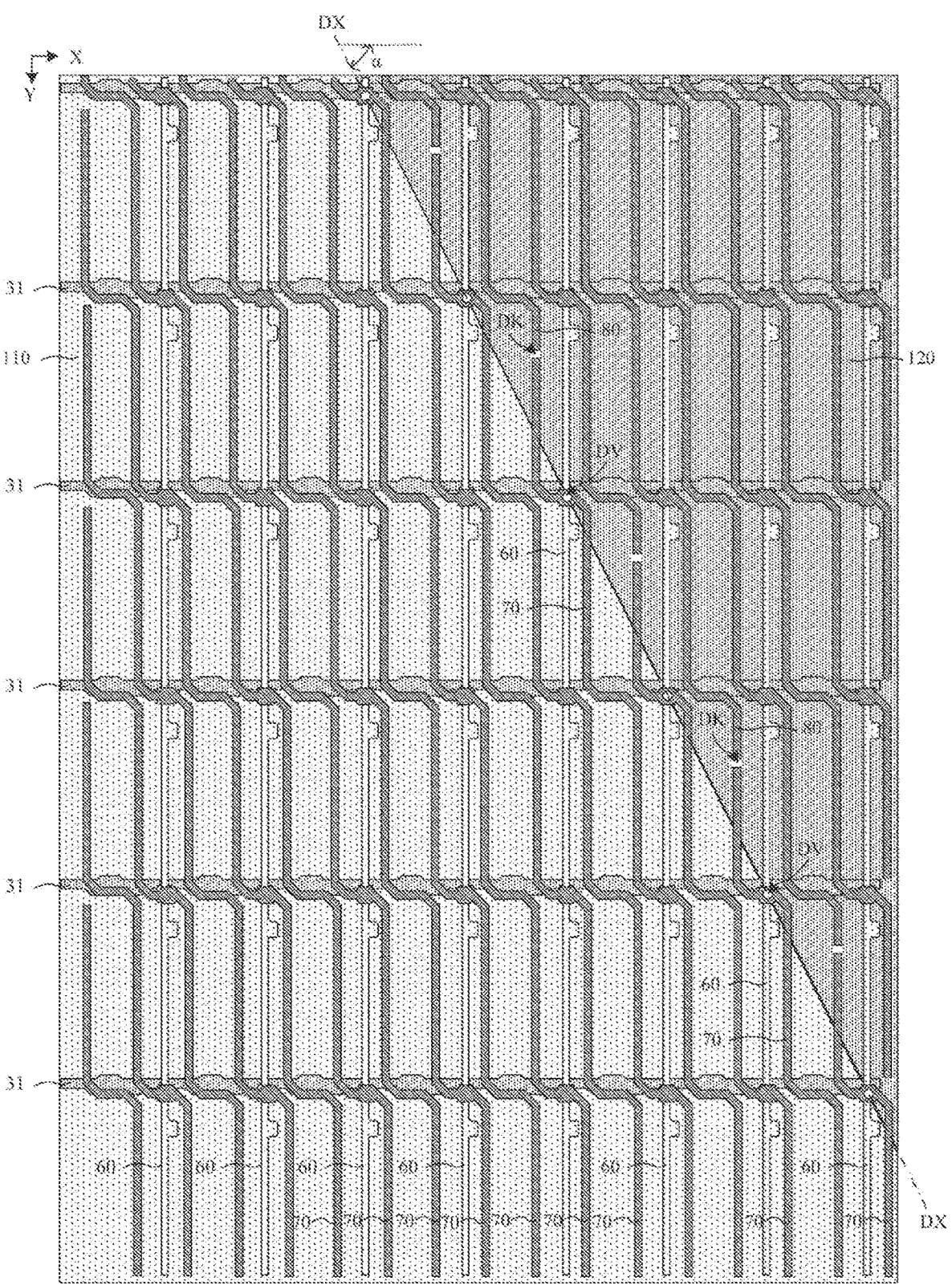
FIGS. 7a-7f are schematic diagrams of a structure fanout step sub-lines according to an exemplary embodiment of the present disclosure.

FIG. 7*a* is a schematic diagram of a structure of data fanout lines according to an exemplary embodiment of the present disclosure, and is an enlarged view of region C in FIG. 6. As shown in FIG. 7*a*, the display region may at least include multiple data signal lines 60 having a shape of a line in which the main body part extends along the second direction Y and multiple data fanout lines 70 having a shape of a step. Multiple data fanout lines 70 may be provided in the first region 110. The first terminal of the data fanout line 70 is correspondingly connected to multiple lead lines in the bonding region. After the second terminal of the data fanout lines 70 extends in a step-like way in a direction away from the bonding region, the data fanout lines 70 are correspondingly connected to multiple data signal lines 60 through multiple overlap vias DV.

In an exemplary embodiment, the data fanout line 70 may include multiple fanout step sub-lines connected sequentially. The fanout step sub-line may at least include a first fanout line and a second fanout line connected to each other, the shape of the first fanout line may be a line shape extending along the first direction X or the opposite direction of the first direction X, and the shape of the second fanout line may be a line shape extending along the second direction Y.

Figure 7B:
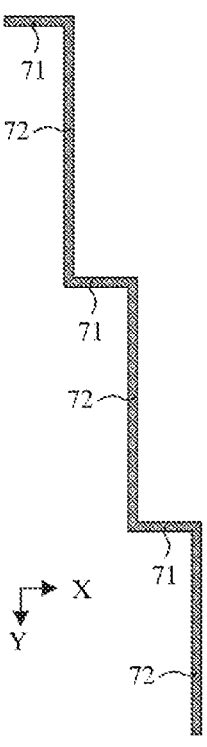

FIG. 7b is a schematic diagram of a structure fanout ladder sub-lines according to an exemplary embodiment of the present disclosure. As shown in FIG. 7b, the fanout step sub-line of the present exemplary embodiment may include a first fanout line 71 and a second fanout line 72, the shape of the first fanout line 71 may be a line shape extending along the first direction X and the shape of the second fanout line 72 may be a line shape extending along the second direction Y.

In an exemplary embodiment, in at least one fanout step sub-line, a first terminal of the first fanout line 71 is connected to a second terminal of the second fanout line 72 in a fanout step sub-line adjacent in the opposite direction of the second direction Y. After a second terminal of the first fanout line 71 extends along the first direction X, it is connected to the first terminal of the second fanout line 72, After the second terminal of the second fanout line 72 extends along the second direction Y, it is connected to the first terminal of the first fanout line 71 in the adjacent fanout step sub-lines in the second direction Y, thus forming a routing mode in which multiple fanout step sub-lines are sequentially connected.

Figure 7C:
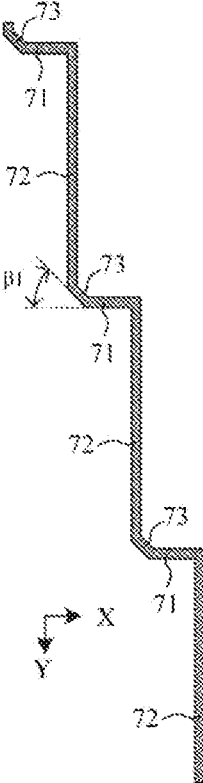

FIG. 7C is another schematic diagram of another structure fanout step sub-lines according to an exemplary embodiment of the present disclosure. As shown in FIG. 7c, a fanout step sub-line of the present exemplary embodiment may include a first fanout line 71, a second fanout line 72, and a third fanout line 73, the shape of the first fanout line 71 may be a line shape extending along the first direction X, the shape of the second fanout line 72 may be a line shape extending along the second direction Y, and the shape of the third fanout line 73 may be a line shape extending along a third direction having a first included angle β1 with the first direction X, and the first included angle β1 may be greater than 0° and less than 90°

In an exemplary embodiment, in at least one fanout step sub-line, a first terminal of the third fanout line 73 is connected to the second terminal of the second fanout line 72 in an adjacent fanout step sub-line in the opposite direction of the second direction Y. After the second terminal of the third fanout line 73 extends along the third direction, it is connected to the first terminal of the first fanout line 71, after a second terminal of the first fanout line 71 extends along the first direction X, it is connected to the first terminal of the second fanout line 72, after the second terminal of the second fanout line 72 extends along the second direction Y, it is connected to the first terminal of the third fanout line 73 in the adjacent fanout ladder sub-lines in the second direction Y, thus forming a routing mode in which multiple fanout step sub-lines are sequentially connected.

In an exemplary embodiment, the first included angle β1 may be about 30° to 60°. For example, the first included angle β1 may be about 45°.

Figure 7D:
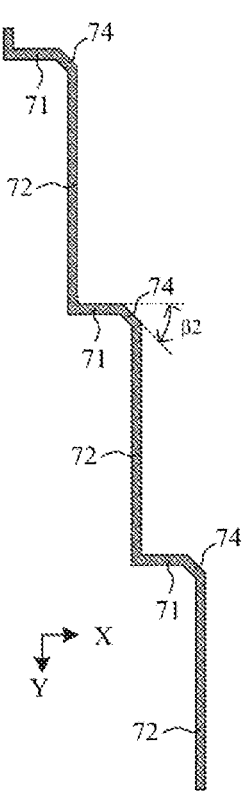

FIG. 7d is another schematic diagram of a structure fanout ladder sub-lines according to an exemplary embodiment of the present disclosure. As shown in FIG. 7d, a fanout step sub-line of the present exemplary embodiment may include a first fanout line 71, a second fanout line 72, and a fourth fanout line 74, the shape of the first fanout line 71 may be a line shape extending along the first direction X, the shape of the second fanout line 72 may be a line shape extending along the second direction Y, and the shape of the fourth fanout line 74 may be a line shape extending along a fourth direction having a second included angle β2 with the first direction X, and the second included angle β2 may be greater than 0° and less than 90°

In an exemplary embodiment, in at least one fanout step sub-line, a first terminal of the first fanout line 71 is connected to a second terminal of the second fanout line 72 in a fanout step sub-line adjacent in the opposite direction of the second direction Y. After the second terminal of the first fanout line 71 extends along the first direction X, it is connected to a first terminal of the fourth fanout line 74, after a second terminal of the fourth fanout line 74 extends along the fourth direction, it is connected to the first terminal of the second fanout line 72, after the second terminal of the second fanout line 72 extends along the second direction Y, it is connected to the first terminal of the first fanout line 71 in the adjacent fanout step sub-lines in the second direction Y, thus forming a routing mode in which multiple fanout step sub-lines are sequentially connected.

In an exemplary embodiment, the second included angle β2 may be about 30° to 60°. For example, the second included angle β2 may be about 45°.

Figure 7E:
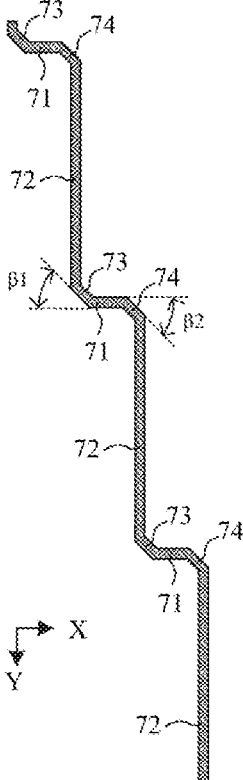

FIG. 7e is another schematic diagram of a structure fanout ladder sub-lines according to an exemplary embodiment of the present disclosure. As shown in FIG. 7e, a fanout step sub-line of the present exemplary embodiment may include a first fanout line 71, a second fanout line 72, a third fanout line 73, and a fourth fanout line 74, the shape of the first fanout line 71 may be a line shape extending along the first direction X, the shape of the second fanout line 72 may be a line shape extending along the second direction Y, the shape of the third fanout line 73 may be a line shape extending along the third direction, and the shape of the fourth fanout line 74 may be a line shape extending along the fourth direction, there is a first included angle β1 between the third direction and the first direction X, and the first included angle 31 may be greater than 0° and less than 90°, and there is a second included angle β2 between the fourth direction and the first direction X, and the second included angle β2 may be greater than 0° and less than 90°.

In an exemplary embodiment, in at least one fanout step sub-line, a first terminal of the third fanout line 73 is connected to the second terminal of the second fanout line 72 in an adjacent fanout step sub-line in the opposite direction of the second direction Y. After the second terminal of the third fanout line 73 extends along the third direction, it is connected to the first terminal of the first fanout line 71, after the second terminal of the first fanout line 71 extends along the first direction X, it is connected to a first terminal of the fourth fanout line 74, after the second terminal of the first fanout line 71 extends along the first direction X, it is connected to the first terminal of the second fanout line 72, after the second terminal of the second fanout line 72 extends along the second direction Y, it is connected to the first terminal of the third fanout line 73 in the adjacent fanout ladder sub-lines in the second direction Y, thus forming a routing mode in which multiple fanout step sub-lines are sequentially connected.

In an exemplary embodiment mode, the first included angle may be about 30° to 60°, and the second included angle may be about 30° to 60°. For example, the first included angle β1 may be about 45 degrees, and the second included angle β2 may be about 45 degrees.

Figure 7F:
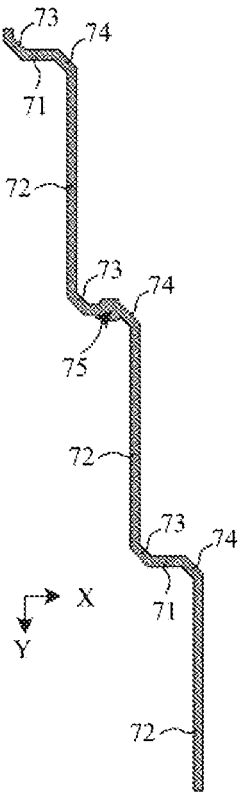

FIG. 7f is another schematic diagram of a structure fanout ladder sub-lines according to an exemplary embodiment of the present disclosure. As shown in FIG. 7F, the fanout step sub-line of the exemplary embodiment may include a first fanout line 71, a second fanout line 72, a third fanout line 73, and a fourth fanout line 74, and the configuration of the fanout step sub-line of the exemplary embodiment is substantially the same as that of the fanout step sub-line shown in FIG. 7e, except that a fanout connection block 75 is further provided on at least one of the fanout step sub-lines.

In an exemplary embodiment, the fanout connection block 75 may be disposed on the first fanout line 71 extending along the first direction X to facilitate placement of the fanout connection block 75.

In some possible exemplary embodiments, the fanout connection block 75 may be disposed on the second fanout line 72, or the fanout connection block 75 may be disposed on the third fanout line 73, or the fanout connection block 75 may be disposed on the fourth fanout line 74, which is not limited herein.

In an exemplary embodiment, the shape of the fanout connection block 75 may be a rectangular shape, the first fanout line 71 and the fanout connection block 75 may be an integral structure connected to each other, and at least one fanout connection block 75 of the fanout step sub-line is configured to be connected to the data signal line through an overlap via.

In an exemplary embodiment, the fanout connection block 75 may be disposed on a part of the fanout step sub-lines in the first region, or the fanout connection block 75 may be disposed on all of the fanout step sub-lines in the first region, and the present disclosure is not limited herein.

As shown in FIGS. 7a to 7f, in the exemplary embodiment, two second fanout lines 72 may be provided between adjacent data signal lines 60 in the first direction X, forming a routing mode in which one circuit unit is inserted into two data fanout lines (one in two insertion modes).

In an exemplary embodiment, the orthographic projection of the second fanout line 72 on the display substrate plane and the orthographic projection of the data signal line 60 on the display substrate plane do not overlap.

In an exemplary embodiment, the display region may further include multiple initial signal lines 31, the shape of which may be a line shape extending along the first direction X, and the initial signal lines 31 are configured to supply an initial voltage signal to the pixel drive circuit. In an exemplary embodiment, the orthographic projection of the first fanout line 71 on the plane of the display substrate at least partially overlaps the orthographic projection of the initial signal line 31 on the plane of the display substrate.

In an exemplary embodiment, the orthographic projection of the multiple overlap vias DV on the display substrate plane at least partially overlaps the orthographic projection of the first overlap via line DX on the display substrate plane, i.e., the multiple overlap vias DV are located on the same obliquely extending first overlap via line DX. In an exemplary embodiment, there is an overlap angle α between the first overlap via line DX and the first direction X, which is greater than 0° and less than 90°

In an exemplary embodiment, the display region may further include multiple dummy lines 80, and the shape of the multiple dummy lines 80 may be stepped. Multiple dummy lines 80 may be disposed in the second region 120. At least one dummy line 80 may include multiple dummy step sub-lines connected sequentially. At least one dummy step sub-line at least include a first dummy line and a second dummy line connected to each other, the shape of the first dummy line may be a line shape extending along the first direction X or the opposite direction of the first direction X, and the shape of the second dummy line may be a line shape extending along the second direction Y.

In an exemplary embodiment, the step-like routing of the multiple dummy lines 80 in the second region may be substantially the same as the step-like routing of the multiple data fanout lines 70 in the first region.

In an exemplary embodiment, at least one dummy step sub-line at least includes a first dummy line and a second dummy line, the first dummy line and the second dummy line have shapes, positions and dimensions substantially identical to those of the first fanout line 71 and the second fanout line 72, respectively.

In another exemplary embodiment, at least one dummy step sub-line at least includes a first dummy line, a second dummy line, and a third dummy line, the shape, position, and size of the first, second, and third dummy lines are substantially the same as the shape, position, and size of the first, second, and third lead lines 71, 72, and 73, respectively.

In another exemplary embodiment, at least one dummy step sub-line at least includes a first dummy line, a second dummy line, and a fourth dummy line. The first dummy line, the second dummy line, and the fourth dummy line have shapes, positions, and dimensions substantially identical to the shapes, positions, and dimensions of the first, second, and fourth lead lines 71, 72, and 74, respectively.

In another exemplary embodiment, at least one dummy step sub-line at least includes a first dummy line, a second dummy line, a third dummy line and a fourth dummy line. The shapes, positions and dimensions of the first dummy line, the second dummy line, the third dummy line and the fourth dummy line are substantially the same as those of the first fanout line 71, the second fanout line 72, the third fanout line 73 and the fourth fanout line 74, respectively.

In an exemplary embodiment, the data fanout lines 70 and the dummy lines 80 may be arranged on the same layer and formed synchronously by the same one-time patterning process.

In an exemplary embodiment, the display region may also include multiple break DKs. For the overlap via DV where the data fanout line 70 is connected to the data signal line 60, the break DK may be provided on the side opposite to the second direction Y of the overlap via DV. The break DK isolates the data fanout line 70 from the dummy line 80, such that the side of the second direction Y of the break DK is the data fanout line 70 and the side opposite to the second direction Y of the break DK is the dummy line 80, thereby achieving insulation between the data fanout line 70 and the dummy line 80.

In an exemplary embodiment, the display substrate may include a first insulating layer, a semiconductor layer, a second insulating layer, a first conductive layer, a third insulating layer, a second conductive layer, a fourth insulating layer, a third conductive layer and a fourth insulating layer sequentially arranged on the base substrate. The data signal line 60 may be disposed in the third conductive layer, and the data fanout line 70 and the dummy line 80 may be disposed in the fourth conductive layer.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which are not limited in present disclosure herein. A "thin film" refers to a layer of thin film made of a material on a base substrate through a process such as deposition, coating, etc. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process at least includes one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary embodiment, taking the display substrate including M unit rows and 2N unit columns as an example, the preparation process of the display substrate in this exemplary embodiment may include the following operations.

Figure 8:
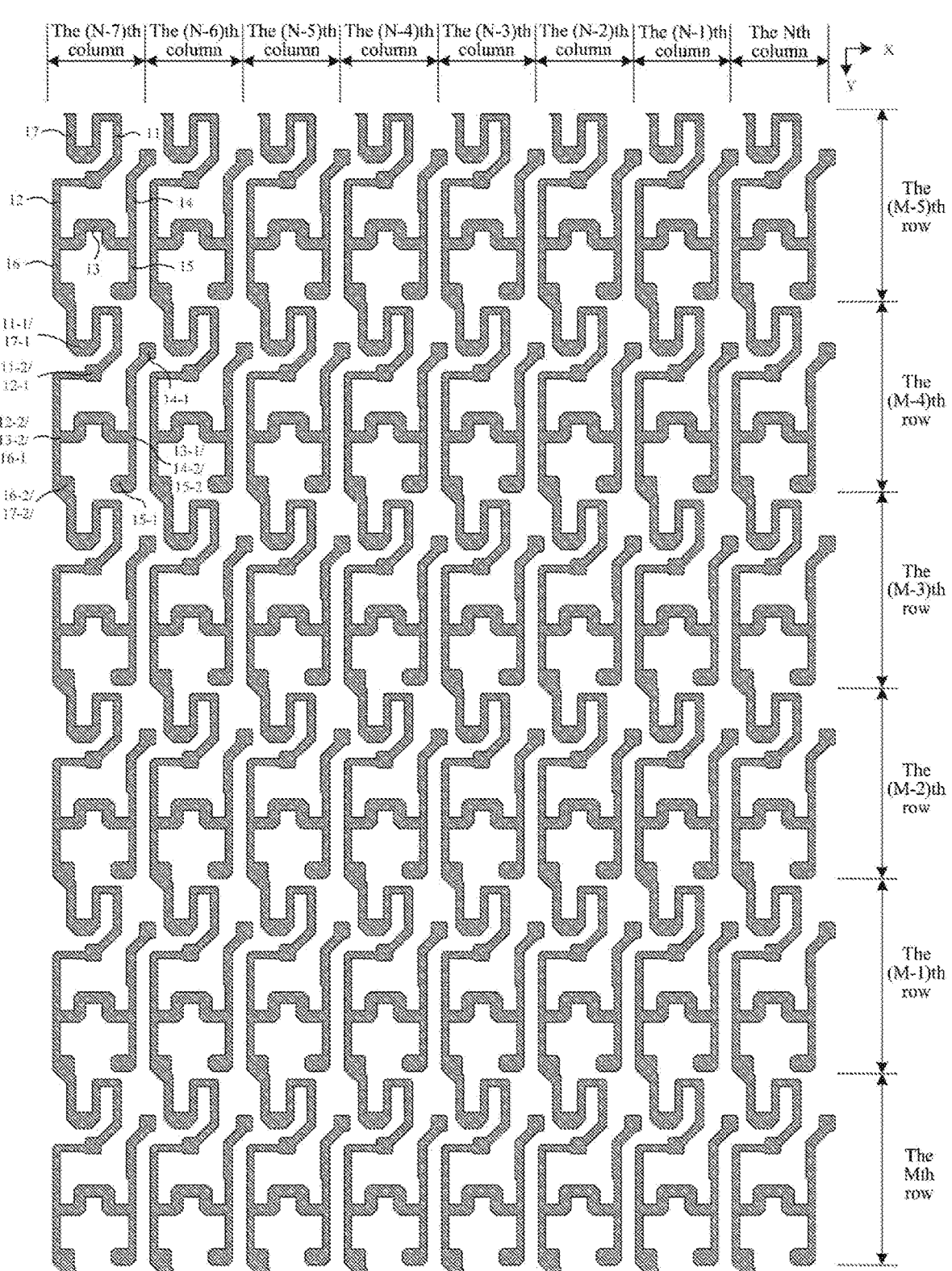
FIG. 8 is a schematic diagram of a display substrate after a semiconductor layer is formed according to an embodiment of the present disclosure.

(11) A pattern of a semiconductor layer is formed. In an exemplary embodiment, forming a pattern of a semiconductor layer may include: depositing sequentially a first insulating thin film and a semiconductor thin film on a base substrate, and patterning the semiconductor thin film through a patterning process to form a first insulating layer covering the shield conductive layer and a pattern of a semiconductor layer disposed on the first insulating layer, as shown in FIG. 8, FIG. 8 is the structure of region C in FIG. 6.

In an exemplary embodiment, the pattern of the semiconductor layer of the first circuit unit and the second conductive unit may at least include a first active layer 11 of the first transistor T1 to a seventh active layer 17 of the seventh transistor T7, and the first active layer 11 to the seventh active layer 17 are of an integral structure connected with one another. In the second direction Y, the sixth active layer 16 in the current row of circuit units and the seventh active layer 17 in the next row of circuit units are connected to each other, that is, the semiconductor layers of adjacent circuit units in each column of circuit units are connected to each other in an integrated structure.

In an exemplary embodiment, in the first direction X, the second active layer 12 and the sixth active layer 16 may be located at the same side of the third active layer 13 in the present circuit unit, the fourth active layer 14 and the fifth active layer 15 may be located at the same side of the third active layer 13 in the present circuit unit, and the second active layer 12 and the fourth active layer 14 may be located at different sides of the third active layer 13 of the present circuit unit. In the second direction Y, the first active layer 11, the second active layer 12, the fourth active layer 14 and the seventh active layer 17 may be located on the side opposite to the second direction Y of the third active layer 13 in this circuit unit. The fifth active layer 15 and the sixth active layer 16 may be located on one side of the third active layer 13 in the second direction Y in this circuit unit.

In an exemplary embodiment, the first active layer 11 may be in an "n" shape, the second active layer 12 and the fifth active layer 15 may be in a "L" shape, the third active layer 13 may be in an "Ω" shape, the fourth active layer 14, the fifth active layer 15, the sixth active layer 16 and the seventh active layer 17 may be in an "I" shape.

In an exemplary embodiment, an active layer of each transistor may include a first region, a second region, and a channel region located between the first region and the second region. In an exemplary embodiment, a first region 11-1 of the first active layer 11 may serve as a first region 17-1 of the seventh active layer 17; a second region 11-2 of the first active layer 11 may serve as a first region 12-1 of the second active layer 12; a first region 13-1 of the third active layer 13 may serve as a second region 14-2 of the fourth active layer 14 and a second region 15-2 of the fifth active layer 15 simultaneously; a second region 13-2 of the third active layer 13 may serve as a second region 12-2 of the second active layer 12 and a first region 16-1 of the sixth active layer 16 simultaneously; a second region 16-2 of the sixth active layer 16 may serve as a second region 17-2 of the seventh active layer 17; a first region 14-1 of the fourth active layer 14 and a first region 15-1 of the fifth active layer 15 may be separately provided.

In an exemplary embodiment, the patterns of the semiconductor layer in the first circuit unit and the second circuit unit may be substantially the same.

Figure 9:
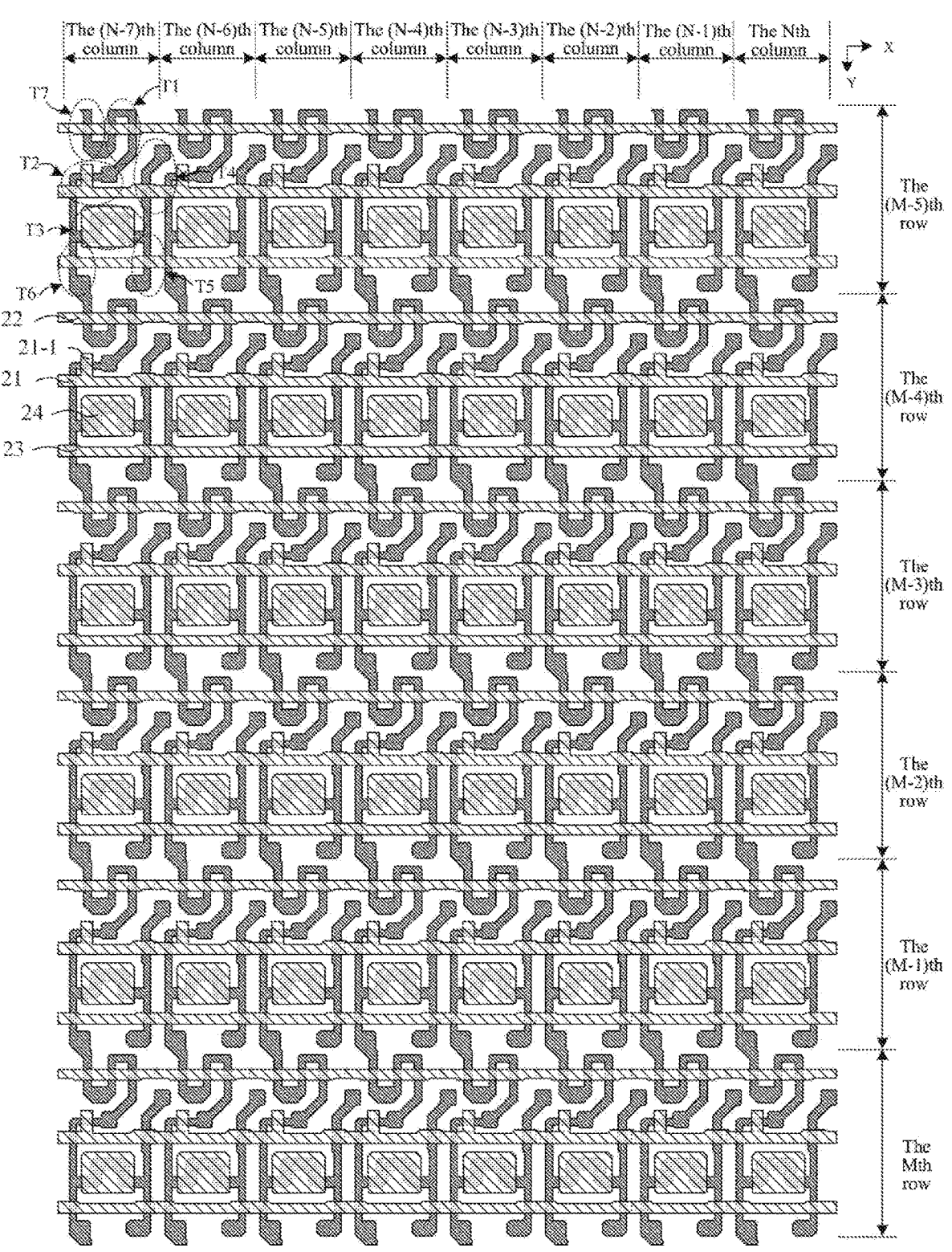
FIG. 9 is a schematic diagram of a display substrate after a first conductive layer is formed according to an embodiment of the present disclosure.

(2) A pattern of a first conductive layer is formed. In an exemplary embodiment, forming a pattern of a first conductive layer may include: sequentially depositing a second insulating thin film and a first conductive thin film on the base substrate on which the above-mentioned pattern is formed, and patterning the first conductive thin film through a patterning process to form a second insulating layer that covers a pattern of the semiconductor layer and form a pattern of the first conductive layer disposed on the second insulating layer, as shown in FIG. 9, which is the structure of region C in FIG. 6. In an exemplary embodiment, the first conductive layer may be referred to as a first gate metal (GATE1) layer.

In an exemplary embodiment, the patterns of the first conductive layer of the first circuit unit and the second circuit unit in the display region may at least include the first scan signal line 21, the second scan signal line 22, the light emitting control line 23, the first electrode plate 24 of the storage capacitor.

In an exemplary embodiment, the first electrode plate 24 may be in a shape of a rectangle, and chamfers may be provided at corners of the rectangle. An orthographic projection of the first electrode plate 24 on the base substrate is at least partially overlapped with an orthographic projection of the third active layer of the third transistor T3 on the base substrate. In an exemplary embodiment, the first electrode plate 24 may serve as a plate of the storage capacitor and a gate electrode of the third transistor T3 simultaneously.

In an exemplary embodiment, the shape of the first scan signal line 21 may be a line shape whose main body part extends along the first direction X, and the first scan signal line 21 may be located on the side of the first electrode plate 24 of the current circuit unit in the opposite direction of the second direction Y. The first scan signal line 21 of each circuit unit is provided with a gate block 21-1, a first terminal of the gate block 21-1 is connected with the first scan signal line 21, and a second terminal of the gate block 21-1 extends towards a direction away from the first electrode plate 24. A region where the first scan signal line 21 and the gate block 21-1 are overlapped with the second active layer of the present circuit unit serves as a gate electrode of the second transistor T2 of a double-gate structure, and a region where the first scan signal line 21 is overlapped with the fourth active layer of the present circuit unit serves as a gate electrode of the fourth transistor T4.

In an exemplary embodiment, the second scan signal line 22 may be of a line shape of which the main body part extends along the first direction X, the second scan signal line 22 may be located at a side of the first scan signal line 21 of the present circuit unit away from the first electrode plate 24, a region where the second scan signal line 22 is overlapped with the first active layer of the present circuit unit serves as a gate electrode of the first transistor T1 of a double-gate structure, and a region where the second scan signal line 22 is overlapped with the seventh active layer of the present circuit unit serves as a gate electrode of the seventh transistor T7.

In an exemplary embodiment, the light emitting control line 23 may be of a line shape of which the main body part extends along the first direction X, the light emitting control line 23 may be located at a side of the first electrode plate 24 of the present circuit unit close to the second direction Y, a region where the light emitting control line 23 is overlapped with the fifth active layer of the present circuit unit serves as a gate electrode of the fifth transistor T5, and a region where the light emitting control line 23 is overlapped with the sixth active layer of the present circuit unit serves as a gate electrode of the sixth transistor T6.

In an exemplary embodiment, the first scan signal line 21, the second scan signal line 22, and the light emitting control line 23 may be in an equal width design, or may be in a non-equal width design, may be straight lines, or may be polygonal lines, which may not only facilitate the layout of the pixel structure, but also reduce the parasitic capacitance between the signal lines, and this is not limited in the present disclosure.

In an exemplary embodiment, after the pattern of the first conductive layer is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first transistor T1 to the seventh active layer are all made to be conductive.

In an exemplary embodiment, the patterns of the first conductive layer in the first circuit unit and the second circuit unit may be substantially the same.

Figure 10:
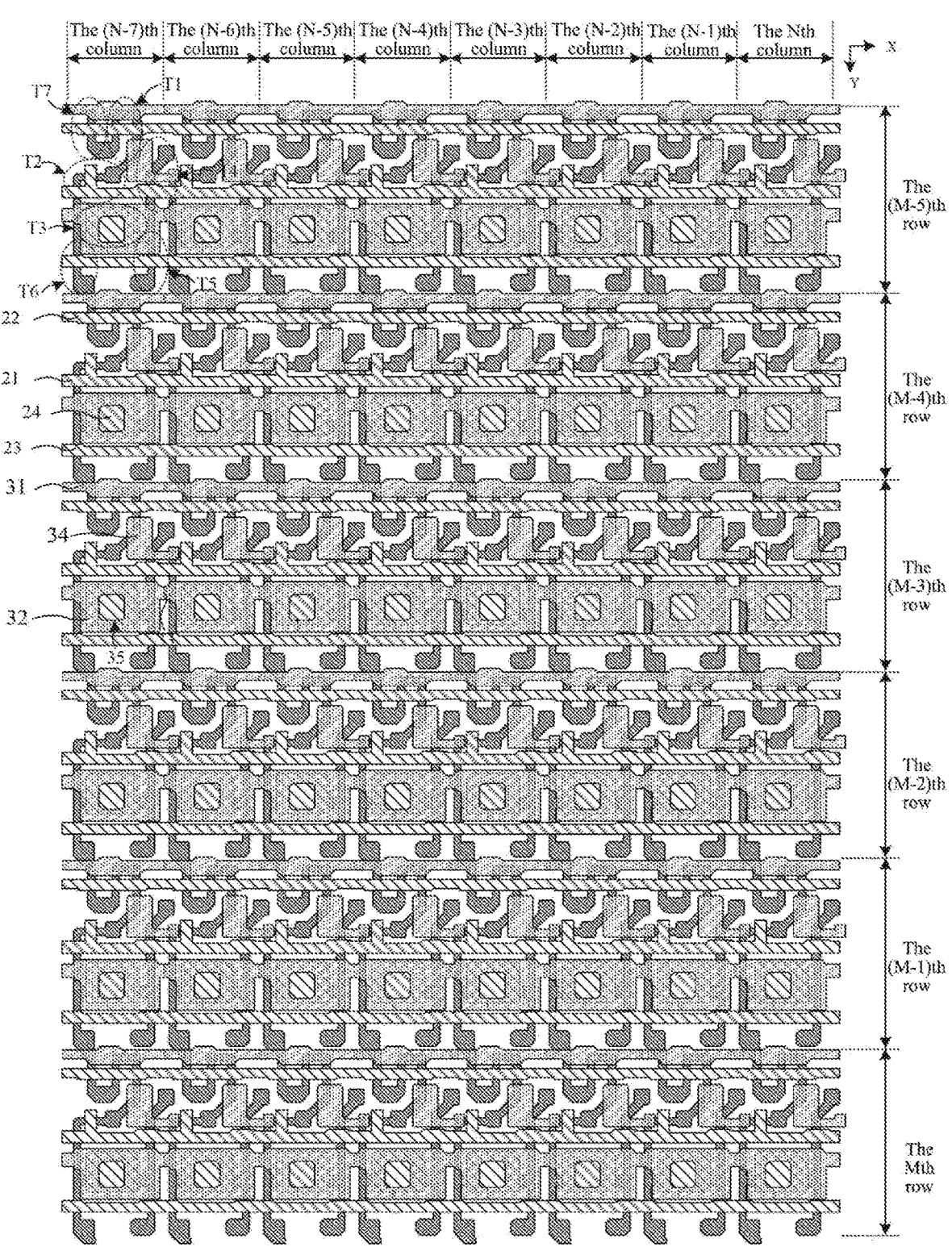
FIG. 10 is a schematic diagram of a display substrate after a second conductive layer is formed according to an embodiment of the present disclosure.

(3) A pattern of a second conductive layer is formed. In an exemplary embodiment, forming the pattern of the second conductive layer may include: a third insulating thin film and a second conductive thin film are deposited sequentially on the base substrate on which the afore-mentioned pattern is formed, and the second conductive thin film is patterned by a patterning process to form a third insulating layer covering the first conductive layer and a pattern of a second conductive layer disposed on the third insulating layer, as shown in FIG. 10, FIG. 10 is the structure of region C in FIG. 6. In an exemplary embodiment, the second conductive layer may be referred to as a second gate metal (GATE2) layer.

In an exemplary embodiment, the second conductive layer patterns of the first circuit unit and the second circuit unit in the display region at least includes an initial signal line 31, a second electrode plate 32 of a storage capacitor, an electrode connection line 33, and a shield electrode 34.

In an exemplary embodiment, a profile of second electrode plate 32 may be in the shape of a rectangle, corners of which in shape of the rectangle may be provided with a chamfer. There is an overlapped region between an orthographic projection of the second electrode plate 32 on the base substrate and an orthographic projection of the first electrode plate 24 on the base substrate, the second electrode plate 32 can be used as another electrode plate of the storage capacitor, and the first electrode plate 24 and the second electrode plate 32 form the storage capacitor of the pixel drive circuit. The second electrode plate 32 is provided with an opening 35 which may be rectangular and may be located in the middle of the second electrode plate 32, so that the second electrode plate 32 forms an annular structure. The opening 35 exposes the third insulating layer covering the first electrode plate 24, and the orthographic projection of the first electrode plate 24 on the base substrate contains an orthographic projection of the opening 35 on the base substrate. In an exemplary embodiment, the opening 35 is configured to accommodate a first via formed subsequently, which is located in the opening 35 and exposes the first electrode plate 24, so that a second electrode of the first transistor T1 formed subsequently is connected with the first electrode plate 24.

In an exemplary embodiment, the second electrode plates 32 of two adjacent sub-pixels in one unit row are connected with each other by a electrode plate connection line 33. For example, the second electrode plate 32 of the (N−2)th column and the second electrode plate 32 of the (N−1)th column is connected with each other by the electrode plate connection line 33. For example, the second electrode plate 32 of the (N−1)th column and the second electrode plate 32 of the Nth column may be connected with each other by the electrode plate connection line 33. In some exemplary embodiments, since the second electrode plate 32 in each circuit unit is connected with a first power supply line formed subsequently, by forming an integral structure connected with each with second electrode plates 32 of adjacent circuit unit, the second electrode plates in the integral structure may be reused as power supply signal lines, it may be ensured that multiple second electrode plates in one unit row have a same potential, which is beneficial to improving uniformity of the panel and avoiding a poor display of the display substrate, thereby ensuring a display effect of the display substrate.

In an exemplary embodiment, the initial signal line 31 may be of a line shape of which the main body part extends along the first direction X. The initial signal line 31 may be located at a side of the second scan signal line 22 of the present circuit unit away from the first scan signal line 21, and the initial signal line 31 is configured to be connected with a first electrode of the first transistor T1 (also a first electrode of the seventh transistor T7) which is formed subsequently.

In an exemplary embodiment, The shape of the shield electrode 34 may be an "L" shape, The shield electrode 34 may be located between the first scan signal line 21 and the second scan signal line 22 of the circuit unit. The shield electrode 34 is configured to shield an influence of a data voltage jump on a key node, prevent the data voltage jump from affecting a potential of the key node of the pixel drive circuit, and improve the display effect.

In an exemplary embodiment, an orthographic projection of the shield electrode 34 on the base substrate at least partially overlaps with an orthographic projection of the first region of the second active layer on the base substrate.

In an exemplary embodiment, the patterns of the second conductive layer in the first circuit unit and the second circuit unit may be substantially the same.

Figure 11:
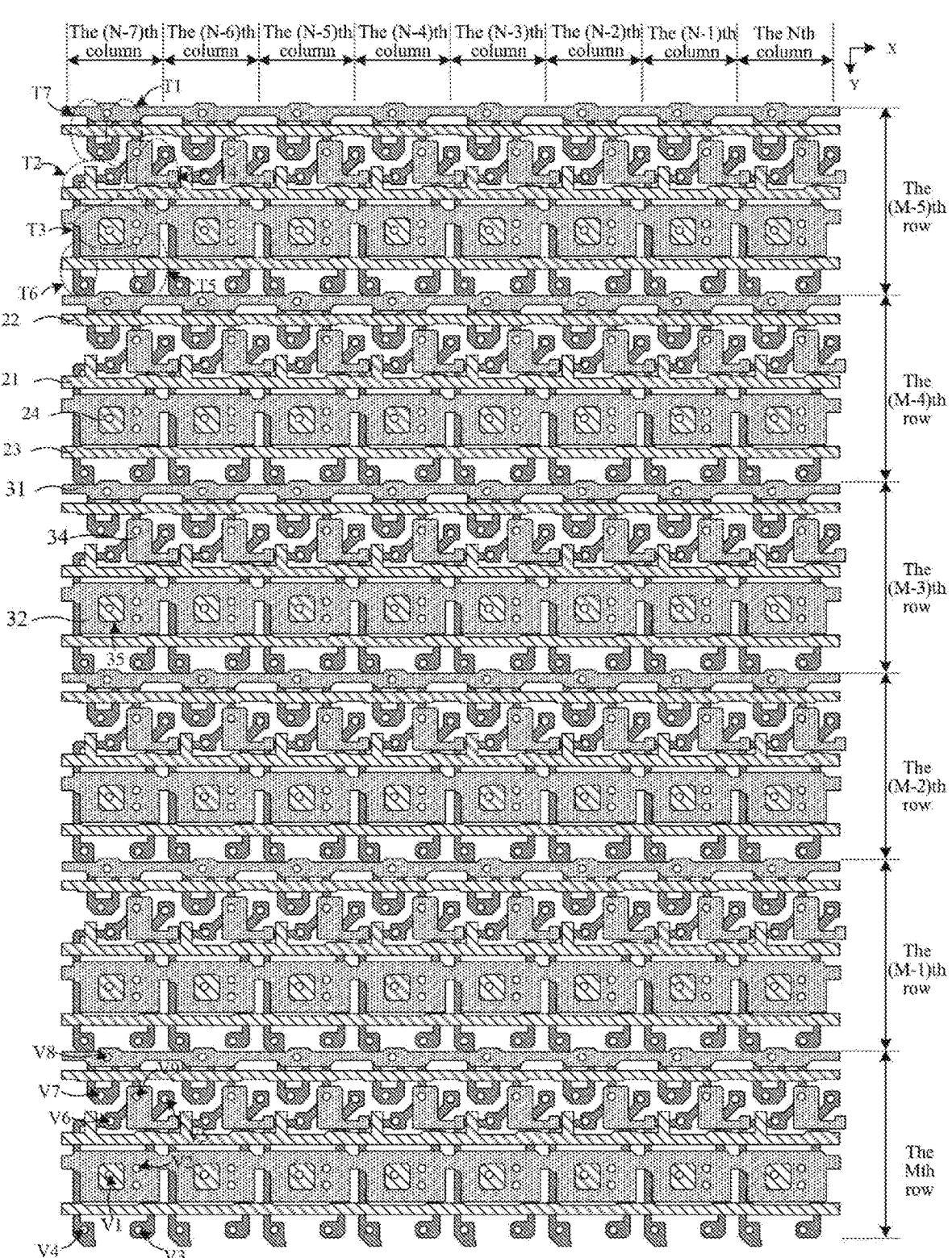
FIG. 11 is a schematic diagram of a display substrate after a fourth insulating layer is formed according to an embodiment of the present disclosure.

(4) A pattern of a fourth insulating layer is formed. In an exemplary embodiment, forming a pattern of a fourth insulating layer may include: depositing a fourth insulating thin film on the base substrate on which the aforementioned patterns are formed, and patterning the fourth insulating thin film by a patterning process, to form a fourth insulating layer covering the second conductive layer, wherein multiple vias are provided on the fourth insulating layer, as shown in FIG. 11. FIG. 11 is the structure of region C in FIG. 6.

In an exemplary embodiment mode, the multiple vias of the first circuit unit and the second circuit unit in the display region at least include a first via V1, a second via V2, a third via V3, a fourth via V4, a fifth via V5, a sixth via V6, a seventh via V7, an eighth via V8 and a ninth via V9.

In an exemplary embodiment, an orthographic projection of the first via V1 on the base substrate is within a range of an orthographic projection of the opening 35 on the base substrate, the fourth insulating layer and the third insulating layer in the first via V1 are etched away to expose a surface of the first electrode plate 24, and the first via V1 is configured such that the second electrode of the first transistor T1 formed subsequently (also the first electrode of the second transistor T2) is connected with the first electrode plate 24 through the via V1.

In an exemplary embodiment, an orthographic projection of the second via V2 on the base substrate is within a range of an orthographic projection of the second electrode plate 32 on the base substrate, the fourth insulating layer in the second via V2 is etched away to expose a surface of the second electrode plate 32, and the second via V2 is configured such that the first power supply line formed subsequently is connected with the second electrode plate 32 through the via V2. In an exemplary embodiment, there may be multiple second vias V2, and the multiple second vias V2 may be disposed in sequence along the second direction Y to improve connection reliability.

In an exemplary embodiment, an orthographic projection of the third via V3 on the base substrate is within a range of an orthographic projection of the first region of the fifth active layer on the base substrate. The fourth insulating layer, the third insulating layer and the second insulating layer in the third via V3 are etched away to expose a surface of the first region of the fifth active layer, and the third via V3 is configured such that the first power supply line formed subsequently is connected with the first region of the fifth active layer through the via V3.

In an exemplary embodiment, an orthographic projection of the fourth via V4 on the base substrate is within a range of an orthographic projection of the second region of the sixth active layer (also the second region of the seventh active layer) on the base substrate. The fourth insulating layer, the third insulating layer and the second insulating layer in the fourth via V4 are etched away to expose a surface of the second region of the sixth active layer, the fourth via V4 is configured such that the second electrode of the sixth transistor T6 (also the second electrode of the seventh transistor T7) formed subsequently is connected with the second region of the sixth active layer through the via V4.

In an exemplary embodiment, an orthographic projection of the fifth via V5 on the base substrate is within a range of an orthographic projection of the first region of the fourth active layer on the base substrate. The fourth insulating layer, the third insulating layer and the second insulating layer in the fifth via V5 are etched away to expose a surface of the first region of the fourth active layer, and the fifth via V5 is configured such that the data signal line formed subsequently is connected with the first region of the fourth active layer through the via V5.

In an exemplary embodiment, an orthographic projection of the sixth via V6 on the base substrate is within a range of an orthographic projection of the second region of the first active layer (also the first region of the second active layer) on the base substrate. The fourth insulating layer, the third insulating layer and the second insulating layer in the sixth via V6 are etched away to expose a surface of the second region of the first active layer, the sixth via V6 is configured such that the second electrode of the first transistor T1 (also the first electrode of the second transistor T2) formed subsequently is connected with the second region of the first active layer (also the first region of the second active layer) through the via V6.

In an exemplary embodiment, an orthographic projection of the seventh via V7 on the base substrate is within a range of an orthographic projection of the first region of the first active layer (also the first region of the seventh active layer) on the base substrate. The fourth insulating layer, the third insulating layer and the second insulating layer in the seventh via V7 are etched away to expose a surface of the first region of the first active layer, the seventh via V7 is configured such that the first electrode of the first transistor T1 (also the first electrode of the seventh transistor T7) formed subsequently is connected with the first region of the first active layer (also the first region of the seventh active layer) through the via V7.

In an exemplary embodiment, an orthographic projection of the first via V8 on the base substrate is within a range of an orthographic projection of the opening 31 on the base substrate, the fourth insulating layer and the third insulating layer in the first via V8 are etched away to expose a surface of the first electrode plate 24, and the first via V8 is configured such that the second electrode of the first transistor T1 formed subsequently (also the first electrode of the second transistor T7) is connected with the first electrode plate 24 through the via V1.

In an exemplary embodiment, the orthographic projection of the ninth via V9 on the base substrate is within the range of the orthographic projection of the shield electrode 34 on the base substrate. The fourth insulating layer in the ninth via V9 is etched away, exposing the surface of the shield electrode 34, and the ninth via V9 is configured such that the subsequently formed first power supply line is connected to the shield electrode 34 through the via.

In an exemplary embodiment, the multiple vias patterns in the first circuit unit and the second circuit unit may be substantially the same.

Figure 12:
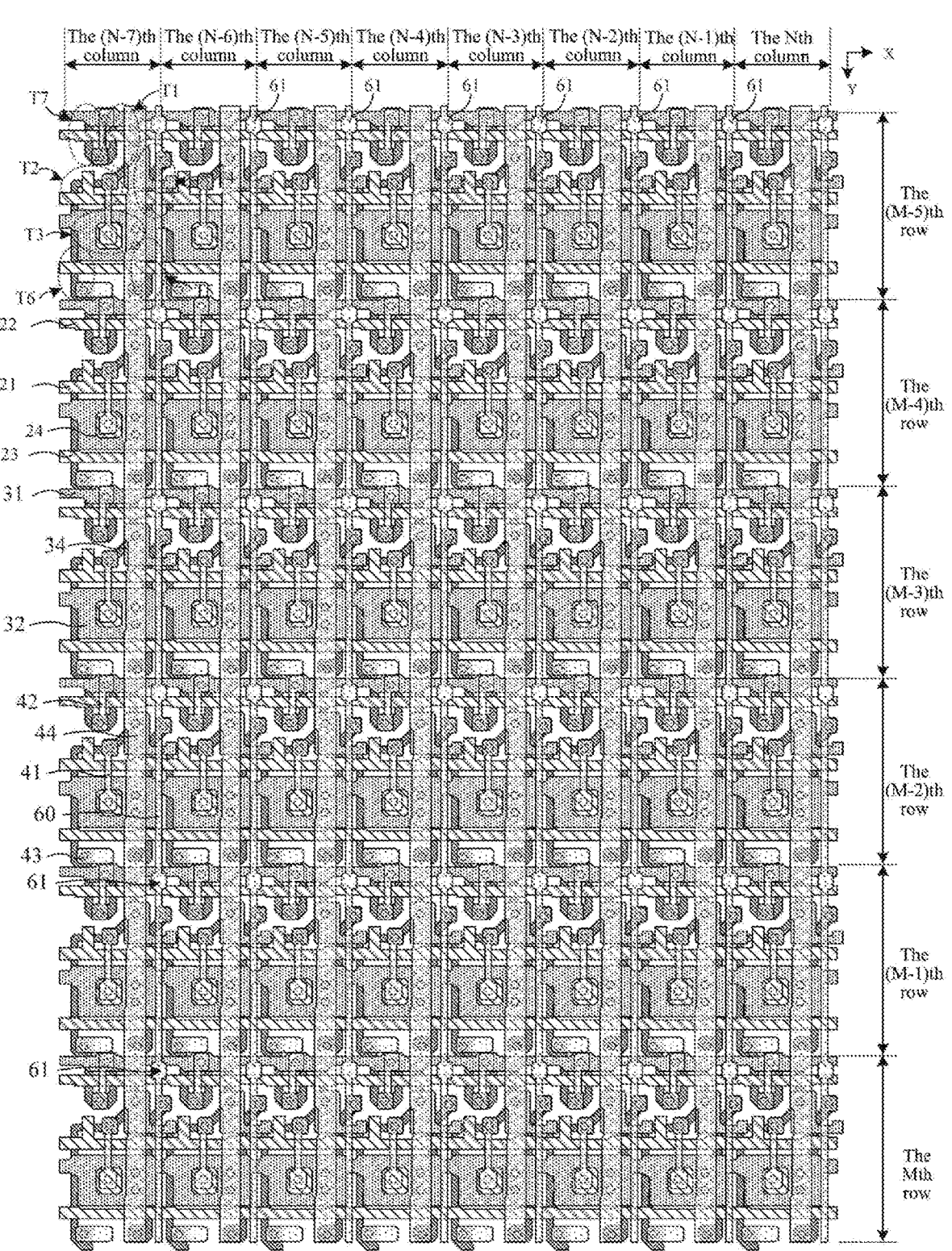
FIG. 12 is a schematic diagram of a display substrate after a third conductive layer is formed according to an embodiment of the present disclosure.

(5) A pattern of a third conductive layer is formed. In an exemplary embodiment, forming a third conductive layer may include: depositing a third conductive thin film on the base substrate on which the above-mentioned patterns are formed, and patterning the third conductive thin film through a patterning process to form a third conductive layer disposed on the fourth insulating layer, as shown in FIG. 12, FIG. 12 is the structure of region C in FIG. 6. In an exemplary embodiment, the third conductive layer may be referred to as a first source drain metal (SD1) layer.

In an exemplary embodiment, the third conductive layer of the first circuit unit and the second circuit unit in the display region at least includes a first connection electrode 41, a second connection electrode 42, a third connection electrode 43, a first power supply line 44, and a data signal line 60.

In an exemplary embodiment, the first connection electrode 41 may be of a straight line shape of which the main body part extends along the second direction Y. The first terminal of the first connection electrode 41 is connected with the first electrode plate 24 through the first via V1, and the second terminal of the first connection electrode 41 is connected with the second region of the first active layer (also the first region of the second active layer) through the sixth via V6, so that the first plate 24, the second region of the first active layer and the first region of the second active layer have the same potential. In an exemplary embodiment, the first connection electrode 41 may serve as the second electrode of the first transistor T1 and the first electrode of the second transistor T2 simultaneously.

In an exemplary embodiment, the second connection electrode 42 may be of a polygonal line shape of which the main body part extends along the second direction Y. A first terminal of the second connection electrode 42 is connected with the initial signal line 31 through the eighth via V8, and a second end of the second connection electrode 42 is connected with the first region of the first active layer (also a first region of the seventh active layer) through the seventh via V7. In an exemplary embodiment, the second connection electrode 42 may serve as the first electrode of the first transistor T1 and the first electrode of the seventh transistor T7 simultaneously.

In an exemplary embodiment, the third connection electrode 43 may be of a rectangular shape, and the third connection electrode 43 is connected with the second region of the sixth active layer (also the second region of the seventh active layer) through the fourth via V4. In an exemplary embodiment, the third connection electrode 43 may serve as the second electrode of the sixth transistor T6 and the second electrode of the seventh transistor T7 simultaneously, and the third connection electrode 43 is configured to be connected with an anode connection electrode formed subsequently.

In an exemplary embodiment, the first power supply line 44 may be of a straight line shape of which the main body part extends along the second direction Y. On the one hand, the first power supply line 44 is connected with the second electrode plate 32 through the second via V2, on the other hand, the first power supply line 44 is connected with the first region of the fifth active layer through the third via V3, and on still another hand, the first power supply line 44 is connected with the shield electrode 34 through the ninth via V9, so that a power supply signal is written to the first electrode of the fifth transistor T5, and the second electrode plate 32, the first electrode of the fifth transistor T5, and the shield electrode 34 have the same potential.

In an exemplary embodiment, the first power supply lines 44 of each circuit unit may be of an unequal width design, and the first power supply lines 44 adopting the unequal width design may not only facilitate a layout of the pixel structure, but also reduce a parasitic capacitance between the first power supply line and the data signal line.

In an exemplary embodiment, because the shield electrode 34 is connected with the first power supply line 41, and at least a part of the region of the shield electrode 34 (such as the vertical part on the left side of the shield electrode 34) is located between the first connection electrode 41 (as the second electrode of the first transistor T1 and the first electrode of the second transistor T2, that is, the second node N2) and the data signal line 42, at least a part of the region of the shield electrode 34 (such as the horizontal part on the right side of the shield electrode 34) at least partially overlaps with the first region of the second active layer, the influence of data voltage jump on the key node of the pixel drive circuit is effectively shielded, the influence of data voltage jump on the potential of the key node of the pixel drive circuit is avoided, and the display effect is improved.

In an exemplary embodiment, the data signal line 60 may be of a straight line shape of which the main body part extends along the second direction Y. The data signal line 60 is connected with a first region of the fourth active layer through the fifth via V5, such that a data signal is written to the first electrode of the fourth transistor T4.

In an exemplary embodiment, a data connection block 61 may also be provided in part of the first circuit unit, the data connection block 61 may have a rectangular shape, may be provided on one side of the first direction X of the data signal line 60 and/or on the opposite side of the first direction X, and connected to the data signal line 60. In an exemplary embodiment, a data connection block 61 in a part of the first circuit unit is configured to connect with a data fanout line formed subsequently through an overlap via.

In an exemplary embodiment, s data connection block 61 may be provided in both the first circuit unit and the second circuit unit, the position and shape of the data connection block 61 in the first circuit unit and the second circuit unit may be substantially the same, so that the third conductive layers of the multiple first circuit units and the third conductive layers of the multiple second circuit units exhibit similar topography to improve uniformity of process and uniformity of display.

In an exemplary embodiment, the patterns of the third conductive layer in the first circuit unit and the second circuit unit may be substantially the same.

Figure 13:
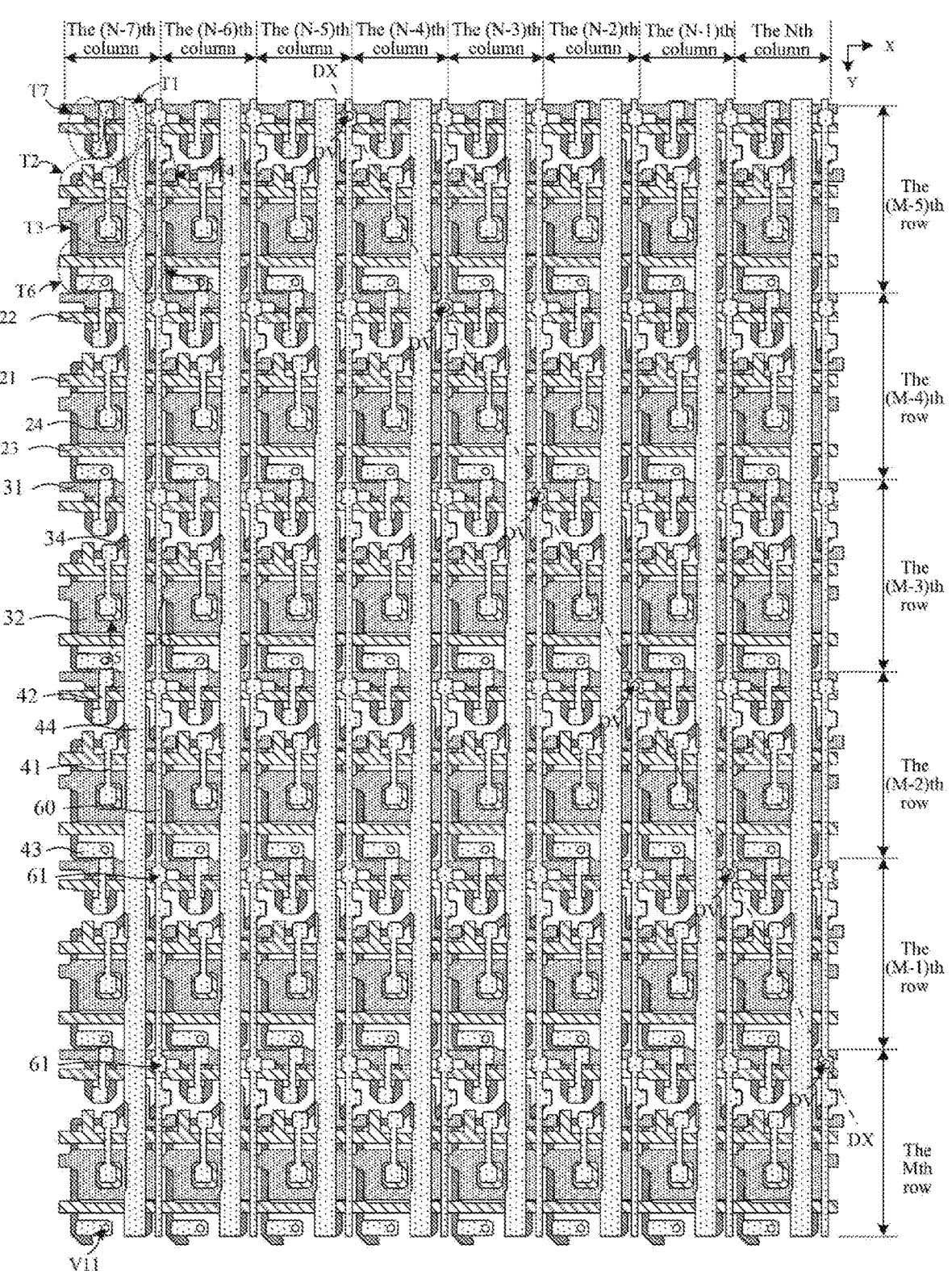
FIG. 13 is a schematic diagram of a display substrate after a first planarization layer is formed according to an embodiment of the present disclosure.

(6) A pattern of a first planarization layer is formed. In an exemplary embodiment, forming a pattern of a first planarization layer may include: coating a first planarization thin film on the base substrate on which the above-mentioned patterns are formed, and patterning the first planarization thin film through a patterning process to form a first planarization layer covering the third conductive layer, wherein the planarization layer is provided with multiple vias, as shown in FIG. 13, FIG. 13 is the structure of region C in FIG. 6.

In an exemplary embodiment, the multiple vias of the first circuit unit and the second circuit unit in the display region at least include an eleventh via V11.

In an exemplary embodiment, an orthographic projection of the eleventh via V11 on the base substrate is within a range of an orthographic projection of the third connection electrode 43 on the base substrate, the first planarization layer in the eleventh via V11 is removed away to expose a surface of the third connection electrode 43, and the eleventh via V11 is configured such that an anode connection electrode formed subsequently is connected with the third connection electrode 43 through the twenty-third via V23.

In an exemplary embodiment, part of the first circuit unit also includes an overlap via DV, the orthographic projection of the overlap via DV on the base substrate is within the range of the orthographic projection of the data connection block 61 on the base substrate. The first planarization layer in the overlap via DV is removed to expose the surface of the data connection block 61. The overlap via DV is configured to connect a subsequently formed data fanout line to the data connection block 61 through the via.

In an exemplary embodiment, the overlap via DV may be provided in the following first circuit units: the first circuit unit of the (M−5)th row and the (N−5)th column, the first circuit unit of the (M−4)th row and the (N−4)th column, the first circuit unit of the (M−3)th row and the (N−3)th column, the first circuit unit of the (M−2)th row and the (N−2)th column, the first circuit unit of the (M−1)th row and the (N−1)th column, and the first circuit unit of the Mth row and the Nth column.

In an exemplary embodiment, multiple overlap vias DV may be located on the same obliquely extending first overlap via line DX, the orthographic projection of the multiple overlap vias DV on the base substrate at least partially overlap with the orthographic projection of the first overlap via line DX on the base substrate.

In an exemplary embodiment, multiple via patterns in the first circuit unit are different from multiple via patterns in the second circuit unit, in which an eleventh via V11 and an overlap via DV are provided in a part of the first circuit unit, only an eleventh via V11 is provided in another part of the first circuit unit, and only an eleventh via V11 is provided in the second circuit unit.

Figure 14A:
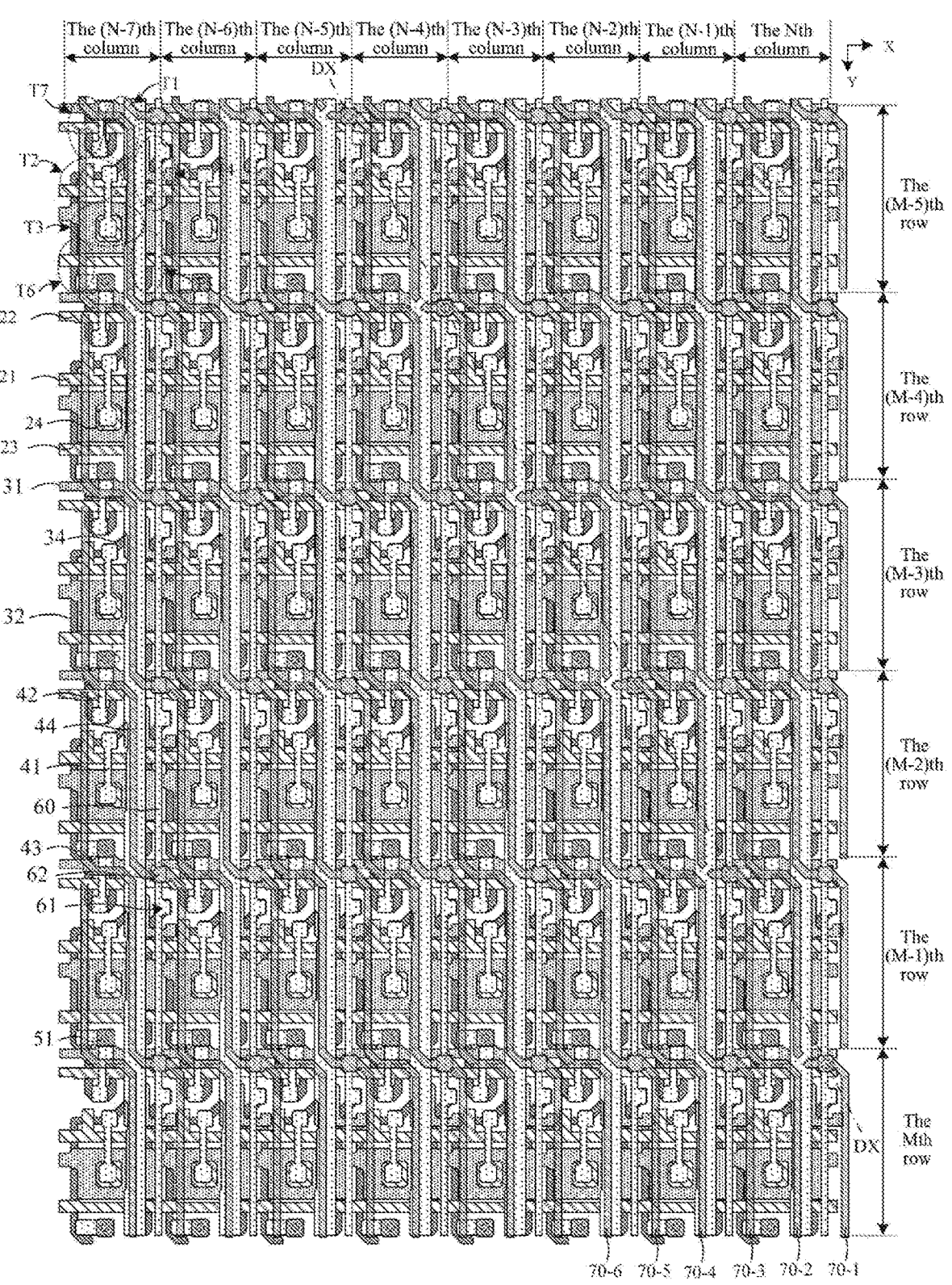
FIG. 14*a* and FIG. 14*b* are schematic diagrams of a display substrate after a fourth conductive layer is formed according to an embodiment of the present disclosure.
Figure 14B:
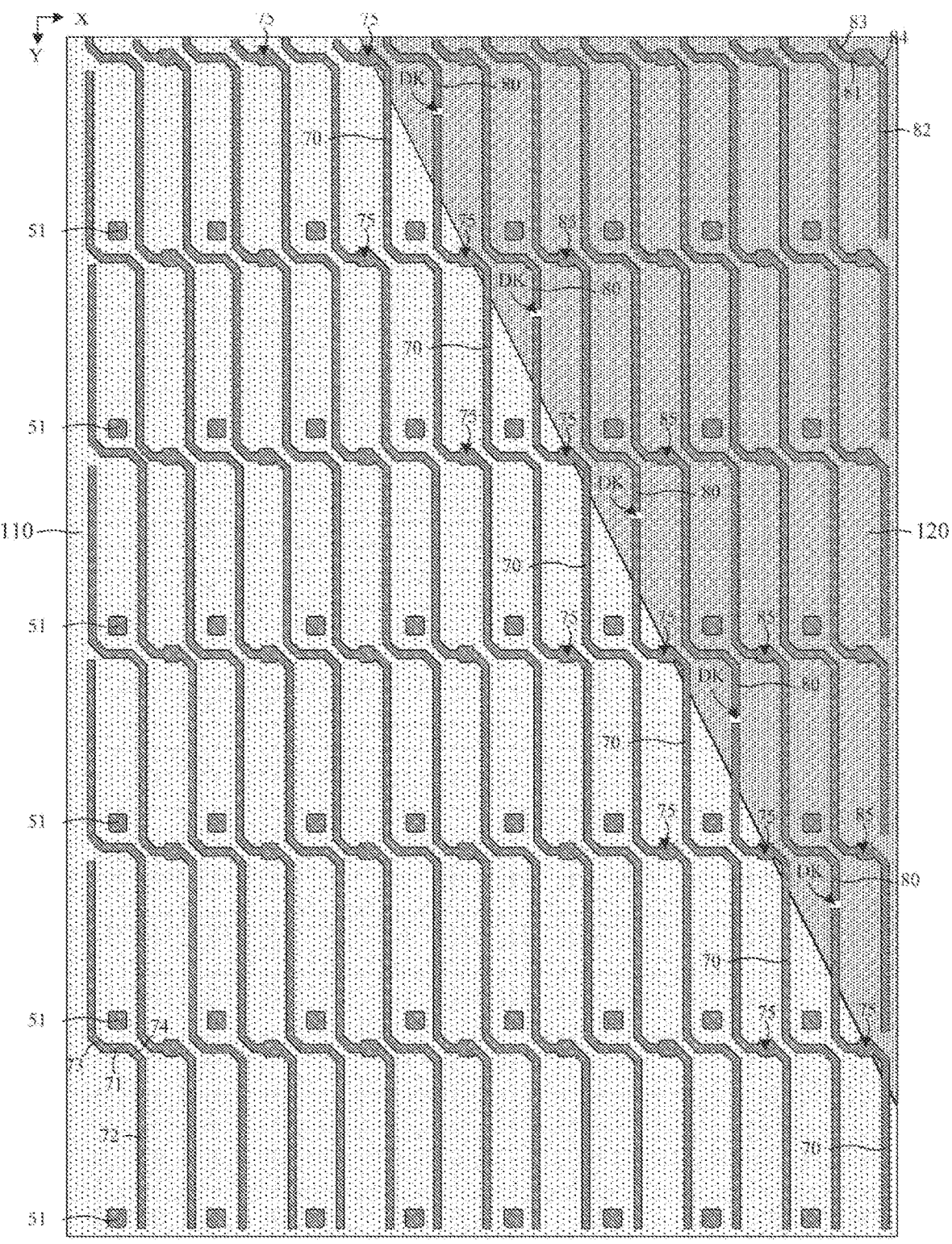

(7) A pattern of a fourth conductive layer is formed. In an exemplary embodiment, forming a pattern of a fourth conductive layer may include: depositing a fourth conductive thin film on the base substrate on which the aforementioned patterns are formed, and patterning the fourth conductive thin film through a patterning process to form a fourth conductive layer disposed on the first planarization layer, as shown in FIG. 14a and FIG. 14b, FIG. 14a is the structure of region C in FIG. 6, and FIG. 14b is a schematic diagram of a structure the fourth conductive layer in FIG. 14a. In an exemplary embodiment, the fourth conductive layer may be referred to as a second source-drain metal layer (SD2).

In an exemplary embodiment, the fourth conductive layer of the first circuit unit in the first region 110 and the second circuit unit in the second region 120 at least includes an anode connection electrode 51.

In an exemplary embodiment, the anode connection electrode 51 may be of a shape of a rectangle and is connected with the third connection electrode 43 through the eleventh via V11. Because the third connection electrode 43 is connected with the second region of the sixth active layer (which is also the second region of the seventh active layer) through the via, thus it is achieved that the anode connection electrode 51 is connected with the second region of the sixth active layer (which is also the second region of the seventh active layer) through the third connection electrode 43. In an exemplary embodiment, the anode connection electrode 51 is configured to be connected with an anode formed subsequently.

In an exemplary embodiment, the fourth conductive layer of the first region 110 further includes multiple step-shaped data fanout lines 70 which are correspondingly connected to multiple data signal lines 60 through overlap vias.

In the exemplary embodiment, after entering the display region from the bonding region, the data fanout line 70-1 is connected to the data signal line 60 of the Nth column through an overlap via in the first circuit unit of the Mth row and the Nth column.

In the exemplary embodiment, after entering the display region from the bonding region, the data fanout line 70-2 passes through the first circuit units in the Mth row and the Nth column, and is connected to the data signal line 60 in the (N−1)th column through an overlap via in the first circuit units in the (M−1)th row and the (N−1)th column to form a stepped data fanout line.

In the exemplary embodiment, after entering the display region from the bonding region, the data fanout line 70-3 passes through the first circuit units of the Mth row and the Nth column and the first circuit units of the (M−1)th row and the (N−1)th column, and is connected to the data signal line 60 of the (N−2)th column through an overlap via in the first circuit units of the (M−2)th row and the (N−2)th column to form a stepped data fanout line.

In an exemplary embodiment, after entering the display region from the bonding region, the data fanout line 70-4 passes through the first circuit units in Mth row and (N−1)th column, the first circuit units in (M−1)th row and (N−1)th column, and the first circuit units in (M−2)th row and (N−2)th column, and is connected to the data signal line 60 in (N−3)th column through an overlap via in the first circuit units in (M−3)th row and (N−3)th column to form a stepped data fanout line.

In an exemplary embodiment, after entering the display region from the bonding region, the data fanout line 70-5 passes through the first circuit units in Mth row and (N−1)th column, the first circuit units in (M−1)th row and (N−2)th column, the first circuit units in (M−2)th row and (N−2)th column, and the first circuit units in (M−3)th row and (N−3)th column, and is connected to the data signal lines 60 in (N−4)th column through an overlap via in the first circuit units in (M−4)th row and (N−4)th column to form a stepped data fanout line.

In an exemplary embodiment, after entering the display region from the bonding region, the data fanout line 70-6 passes through the first circuit units in Mth row and (N−2)th column, the first circuit units in (M−1)th row and (N−2)th column, the first circuit units in (M−2)th row and (N−3)th column, the first circuit units in (M−3)th row and (N−3)th column, and the first circuit units in (M−4)th row and (N−4)th column, and is connected to the data signal lines 60 in (N−5)th column through an overlap via in the first circuit units in (M−5)th row and (N−5)th column to form a stepped data fanout line.

In an exemplary embodiment, at least one data fanout line 70 may include multiple fanout step sub-lines connected sequentially, the multiple fanout step sub-lines may be respectively disposed in multiple first circuit units corresponding to each other, and the at least one fanout step sub-line may include a first fanout line 71, a second fanout line 72, a third fanout line 73 and a fourth fanout line 74 connected sequentially.

In an exemplary embodiment, the first terminal of the third fanout line 73 is connected to the second terminal of the second fanout line 72 in the first circuit unit adjacent in the opposite direction of the second direction Y. After the second terminal of the third fanout line 73 extends along the third direction, it is connected to the first terminal of the first fanout line 71, after the second terminal of the first fanout line 71 extends along the first direction X, it is connected to a first terminal of the fourth fanout line 74, after a second terminal of the fourth fanout line 74 extends along the fourth direction, it is connected to the first terminal of the second fanout line 72, after the second terminal of the second fanout line 72 extends along the second direction Y, it is connected to the first terminal of the third fanout line 73 in the adjacent first circuit unit in the second direction Y, thus forming a routing mode in which multiple fanout step sub-lines are sequentially connected.

In an exemplary embodiment, the at least one fanout step sub-line may also include a fanout connection block 75. The fanout connection block 75 may have a rectangular shape and be provided on the first fanout line 71, and the first fanout line 71 and the fanout connection block 75 may have an integral structure connected to each other.

In an exemplary embodiment, the orthographic projection of the fanout connection block 75 on the base substrate at least partially overlaps with the orthographic projection of the data connection block 61 on the base substrate, and at least one fanout connection block 75 of the fanout step sub-line is configured to connect with the data connection block 61 on the data signal line 60 through an overlap via.

In an exemplary embodiment, the fanout connection block 75 may be disposed in some of the first circuit units in the first region, or the fanout connection block 75 may be disposed in all of the first circuit units in the first region, so that the fourth conductive layers of the multiple first circuit units exhibit similar topography to improve uniformity of the process and uniformity of display.

In an exemplary embodiment, two second fanout lines 72 may be provided between adjacent data signal lines 60 in the first direction X, that is, two data fanout lines may be provided in one first circuit unit, forming a routing mode in which one circuit unit is inserted into two data fanout lines (one in two insertion layout mode).

In an exemplary embodiment, the orthographic projection of the second fanout line 72 on the display substrate plane and the orthographic projection of the data signal line 60 on the display substrate plane do not overlap, and mutual interference between the data signal line 60 and the data fanout line 70 can be effectively avoided.

In an exemplary embodiment, the orthographic projection of the second fanout line 72 on the display substrate plane at least partially overlaps with the orthographic projection of the first power supply line 44 on the display substrate plane, and the shielding effect of the first power supply line 44 can effectively avoid the influence of the data fanout line 70 on the pixel drive circuit.

In an exemplary embodiment, the orthographic projection of the first fanout line 71 on the display substrate plane and the orthographic projection of the initial signal line 31 on the display substrate plane at least partially overlap, and electrical coupling of the data fanout line and the scan signal line can be effectively avoided by shielding the initial signal line 31.

In an exemplary embodiment, the width of the data fanout line 70 may be from about 2.0 mum to 4 mum, and the width may be a dimension perpendicular to an extension direction of the data fanout line.

In an exemplary embodiment, the fourth conductive layer of the second region 120 further includes multiple step-shaped dummy lines 80, the step-shaped routing of the multiple dummy lines 80 may be substantially the same as the step-shaped routing of the multiple data fanout lines 70 in the first region 110.

In an exemplary embodiment, the at least one dummy line 80 may include multiple dummy step sub-lines connected sequentially, the multiple dummy step sub-lines may be respectively disposed in multiple second circuit units corresponding to each other, and at least one dummy step sub-line may include a first dummy line 81, a second dummy line 82, a third dummy line 83, and a fourth dummy line 84 connected sequentially.

In an exemplary embodiment, the first terminal of the third dummy line 83 is connected to the second terminal of the second dummy line 82 in the second circuit unit adjacent in the opposite direction of the second direction Y. After the second terminal of the third dummy line 83 extends along the third direction, it is connected to the first terminal of the first dummy line 81, after the second terminal of the first dummy line 81 extends along the first direction X, it is connected to a first terminal of the fourth dummy line 84, after a second terminal of the fourth dummy line 84 extends along the fourth direction, it is connected to the first terminal of the second dummy line 82, after the second terminal of the second dummy line 82 extends along the second direction Y, it is connected to the first terminal of the third dummy line 83 in the adjacent second circuit unit in the second direction Y, thus forming a routing mode in which multiple dummy step sub-lines are sequentially connected.

In an exemplary embodiment, the at least one dummy step sub-line may also include a dummy connection block 85. The fanout connection block 85 may have a rectangular shape and be provided on the first dummy line 81, and the first dummy line 81 and the fanout connection block 85 may have an integral structure connected to each other.

In an exemplary embodiment, the orthographic projection of the fanout connection block 85 on the base substrate at least partially overlaps with the orthographic projection of the data connection block 61 on the base substrate.

In an exemplary embodiment, the fanout connection block 85 may be disposed in a part of the second circuit unit in the second region. Alternatively, the fanout connection block 85 may be provided in all the second circuit units in the second region. The fourth conductive layers of the multiple second circuit units are made to have similar topography, and the fourth conductive layers of the multiple first circuit units and the fourth conductive layers of the multiple second circuit units are made to have similar topography, so as to improve process uniformity and display uniformity.

In an exemplary embodiment, two second dummy lines 82 may be provided between adjacent data signal lines 60 in the first direction X.

In an exemplary embodiment, the orthographic projection of the second dummy line 82 on the display substrate plane and the orthographic projection of the data signal line 60 on the display substrate plane do not overlap, In an exemplary embodiment, the orthographic projection of the second dummy line 82 on the display substrate plane at least partially overlaps the orthographic projection of the first power supply line 44 on the display substrate plane.

In an exemplary embodiment, the orthographic projection of the first dummy line 81 on the plane of the display substrate at least partially overlaps the orthographic projection of the initial signal line 31 on the plane of the display substrate.

In an exemplary embodiment, the width of the dummy line 80 may be from about 2.0 mum to 4 mum, and the width may be a dimension perpendicular to an extension direction of the dummy line.

In an exemplary embodiment, multiple dummy lines 80 may extend to the bezel region and be connected to the bezel power supply lead lines in the bezel region such that the multiple dummy lines 80 transmit high-voltage power supply signals or low-voltage power supply signals to reduce the voltage drop of the high-voltage power supply signals or the low-voltage power supply signals.

In an exemplary embodiment, a break DK may also be provided in a part of the second circuit unit in the second region 120.

For the first circuit unit in which the data fanout line 70 is connected to the data signal line 60, a break DK may be provided in a second circuit unit on the opposite side of the second direction Y of the first circuit unit. The break DK isolates the data fanout line 70 from the dummy line 80, such that the side of the second direction Y of the break DK is the data fanout line 70 and the side opposite to the second direction Y of the break DK is the dummy line 80, thereby achieving insulation between the data fanout line 70 and the dummy line 80.

The subsequent preparation process may include forming a second planarization layer and the like, and the drive circuit layer is prepared on the glass carrier plate.

In an exemplary embodiment, on a plane parallel to the display substrate, The drive circuit layer of the display region may include multiple circuit units (a first circuit unit and a second circuit unit), each circuit unit may include a pixel drive circuit, and the pixel drive circuit is respectively connected to the first scan signal line 21, the second scan signal line 22, the light emitting control line 23, the initial signal line 31, the first power supply line 44 and the data signal line 60.

In an exemplary embodiment, in a plane perpendicular to the display substrate, the drive circuit layer may at least include a first insulating layer, a semiconductor layer, a second insulating layer, a first conductive layer, a third insulating layer, a second conductive layer, a fourth insulating layer, a third conductive layer, a first planarization layer, and a fourth conductive layer which are disposed sequentially on the base substrate. The semiconductor layer may at least include active layers of the first transistor to the seventh transistor. The first conductive layer may at least include a first scan signal line 21, a second scan signal line 22, a light emitting control line 23, and a first electrode plate 24 of a storage capacitor, the second conductive layer may at least include an initial signal line 31, a second electrode plate 32 of a storage capacitor, a electrode plate connecting line 33 and a shield electrode 34, the third conductive layer may at least include a first connection electrode 41, a second connection electrode 42, a third connection electrode 43, a first power supply line 44, and a data signal line 60, and the fourth conductive layer may at least include an anode connection electrode 51, a data fanout line 70 connected to the data signal line 60 through an overlap via, and a dummy line 80.

In an exemplary embodiment, the base substrate may be a flexible base substrate, or may be a rigid base substrate. The rigid substrate may be made of, but not limited to, one or more of glass and quartz. The flexible substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible base substrate may include a first flexible material layer, a first inorganic material layer, a semiconductor layer, a second flexible material layer, and a second inorganic material layer which are stacked, wherein materials of the first flexible material layer and the second flexible material layer may be polyimide (PI), polyethylene terephthalate (PET), or a surface-treated polymer soft film, or the like. Materials of the first inorganic material layer and the second inorganic material layer may be silicon nitride (SiNx) or silicon oxide (SiOx), or the like, for improving water and oxygen resistance of the base substrate. The material of the semiconductor layer may be amorphous silicon (a-si).

In an exemplary embodiment, the first conductive layer, the second conductive layer, the third conductive layer, and the fourth conductive layer may be made of metal materials, such as any one or more of silver (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulating layer, the second insulating layer, the third insulating layer, and the fourth insulating layer may be made of any one or more of silicon oxide (SiOx), silicon nitride (SiNx), and silicon oxynitride (SiON), and may be single-layer, multilayers, or composite layer. The first insulating layer may be referred to as a Buffer layer, the second insulating layer and the third insulating layer may be referred to as Gate Insulation (GI) layers, and the fourth insulating layer may be referred to as an Interlayer Dielectric (ILD) layer. The first planarization layer may be made of an organic material such as resin. The semiconductor layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene. That is, the embodiment of the present disclosure is applicable to thin film transistors that are manufactured based on oxide technology, silicon technology or organic technology.

In an exemplary embodiment, after the drive circuit layer is prepared, a light emitting structure layer and an encapsulation structure layer may be successively prepared on the drive circuit layer.

In an exemplary embodiment, preparing the light emitting structure layer may include first forming an anode conductive layer, which may at least include multiple anode patterns. Then, a pixel define layer is formed, and a pixel opening is provided on the pixel define layer of each circuit unit, and the pixel define layer in the pixel opening is removed to expose the anode of the circuit unit. Then, an organic emitting layer is formed using an evaporation or ink-jet printing process, and a cathode is formed on the organic light emitting layer.

In an exemplary embodiment mode, the encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is arranged between the first encapsulation layer and the third encapsulation layer, which may ensure that outside water and oxygen cannot enter the light emitting structure layer.

At present, metal wiring (shadowing) is a common defect of display substrate with FIAA structure when the screen is off or at low gray scale. It is found that shadowing is caused by the region partition of data fanout lines. In a display substrate, it often includes a wiring region provided with a data fanout line and a normal region without a data fanout line. Since the data fanout line in the wiring region has a high reflection ability under the irradiation of external light, while the reflection ability of other metal lines in the normal region is weak, so an appearance of the normal region is obviously different from that of the wiring region, which leads to a problem of poor appearance of the display substrate, especially when the metal wiring is obvious when the screen is off or the display is in a low gray tone.

According to a display substrate provide by an exemplary embodiment of that present disclosure, by arranging stepped data fanout lines in the first region and stepped dummy lines in the second region, the step-like routing mode of the data fanout line and the dummy line are basically the same, and the step-like routing is formed in the entire display region, so that the reflection ability of the entire display region is basically similar, effectively eliminating the bad appearance of the visible metal routing when the screen is off or low gray scale display is displayed, and improving the display quality and product quality.

The present disclosure realizes data routing in the display region by arranging data fanout lines in the display region, and the data fanout lines are connected with data signal lines through overlap vias, thus reducing the width of the lower bezel and being beneficial to realizing comprehensive screen display. The invention can effectively reduce the visibility of the overlap vias and improve the uniformity of display by adopting the layout mode of one in two insertion and displacing the overlap vias in different unit rows.

By setting a fanout connection block in a first region, a dummy connection block in a second region, and setting a data connection block in both the first region and the second region, the switch region in the display region presents a similar topography, which can not only improve the process uniformity, but also improve the display uniformity.

By arranging the orthographic projection of the second fanout line on the display substrate plane and the orthographic projection of the data signal line on the display substrate plane without overlapping, the mutual interference between the data signal line and the data fanout line can be effectively avoided. By arranging that the orthographic projection of the first fanout line on the display substrate plane and the orthographic projection of the initial signal line on the display substrate plane at least partially overlap, the electrical coupling between the data fanout line and the scan signal line can be effectively avoided by using the shielding effect of the initial signal line 31.

By connecting multiple dummy lines in the display region with the bezel power supply lead lines in the bezel region, the present disclosure can not only effectively reduce the voltage drop of the high-voltage power supply signal or the low-voltage power supply signal, but also reduce the width of the bezel power supply lead lines in the bezel region, which is beneficial to reducing the width of the bezel region.

The preparation processes in the present disclosure may be compatible well with existing preparation processes, which is simple in process implementation, easy to implement, high in production efficiency and yield, and low in production cost.

Figure 15:
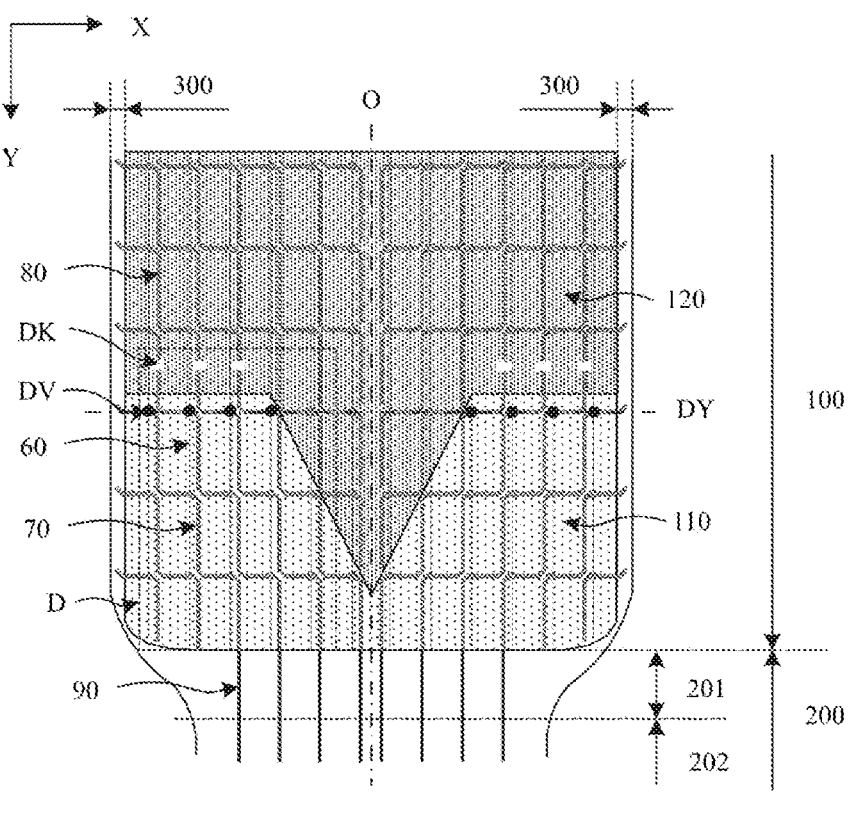
FIG. 15 is a schematic diagram of another planar structure of a display substrate according to an exemplary embodiment of the present disclosure.
Figure 16:
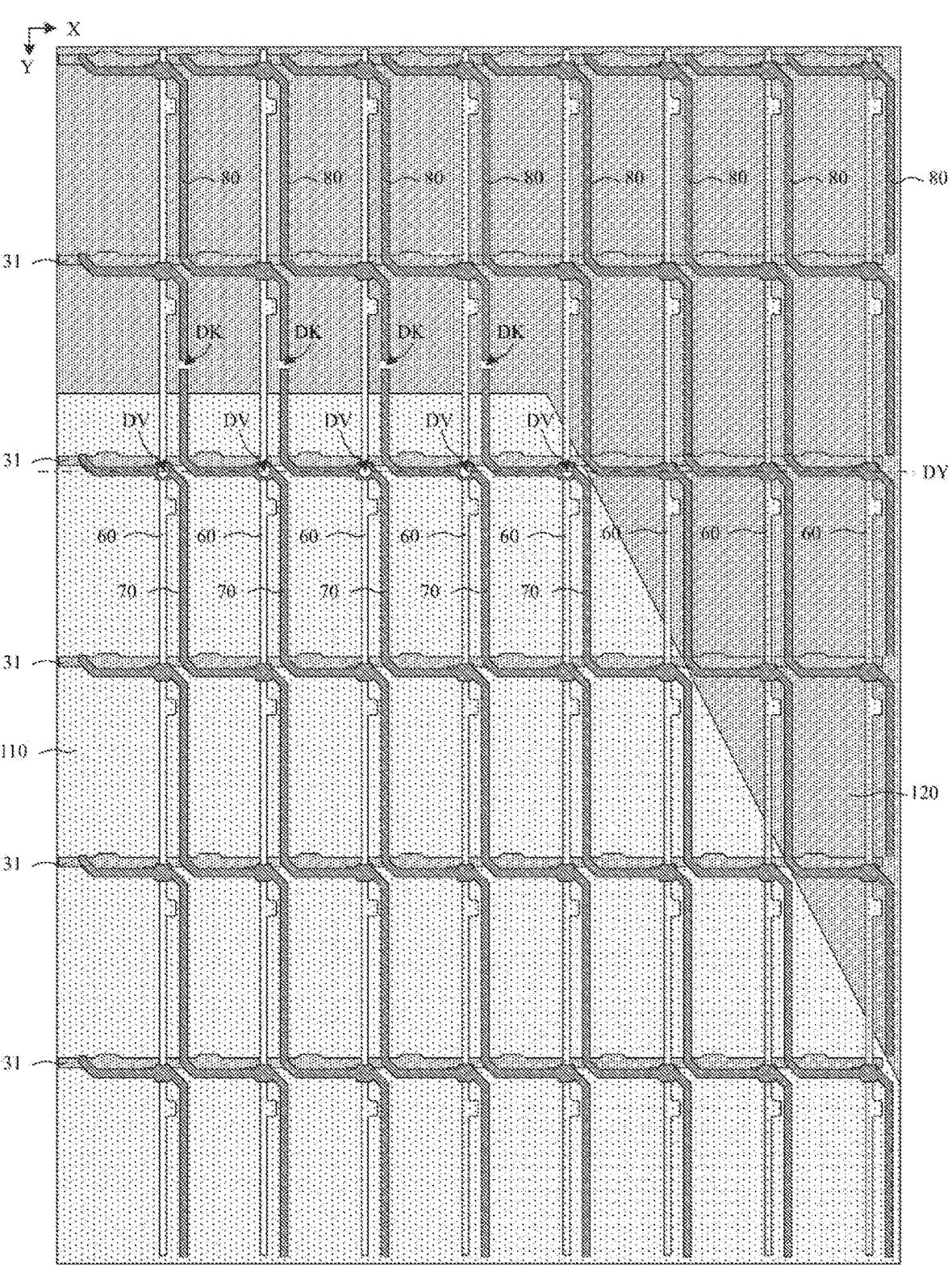
FIG. 16 is a schematic diagram of another structure of data fanout lines according to an exemplary embodiment of the present disclosure.

FIG. 15 is a schematic diagram of another planar structure of a display substrate according to an exemplary embodiment of the present disclosure. FIG. 16 is a schematic diagram of another structure of data fanout lines according to an exemplary embodiment of the present disclosure, which is an enlarged view of region D in FIG. 15, and the data fanout line in the display substrate adopts a FIAA structure. As shown in FIGS. 15 and 16, the main body structure of the display substrate of the present exemplary embodiment is basically the same as that of the foregoing embodiment, except that the display substrate of the present exemplary embodiment is a routing mode in which one circuit unit is inserted into one data fanout line (one in one insertion mode).

In an exemplary embodiment, the multiple data fanout lines 70 in the display region 100 may be stepped, the multiple dummy lines 80 may be stepped, and the step-like routing manner of the multiple dummy lines 80 may be substantially the same as the step-like routing manner of the multiple data fanout lines 70.

In an exemplary embodiment, at least one first circuit unit is provided with an overlap via DV, through which the data fanout line 80 is connected to the data signal line 60.

In an exemplary embodiment, the orthographic projection of the multiple overlap vias DV on the display substrate plane at least partially overlaps the orthographic projection of the second overlap via line DY on the display substrate plane, the second overlap via line DY may be a straight line extending along the first direction X, that is, the multiple overlap vias DV are located on the second overlap via line DY extending in the same horizontal direction.

In an exemplary embodiment, at least one second circuit unit is provided with a break DK that isolates a data fanout line 70 of the first circuit unit from a dummy line 80 of the second circuit unit, enabling insulation between the data fanout line 70 and the dummy line 80.

In an exemplary embodiment, at least one data fanout line 70 may include multiple fanout step sub-lines connected sequentially, at least one fanout step sub-line may include a first lead line and a second lead line connected to each other, alternatively, it may include a first fanout line, a second fanout line and a third fanout line connected to each other, or it may include a first fanout line, a second fanout line and a fourth fanout line connected to each other, or it may include a first fanout line, a second fanout line, a third fanout line and a fourth fanout line connected to each other.

In an exemplary embodiment, at least one dummy line 80 may include multiple dummy step sub-lines connected sequentially, at least one dummy step sub-line may include a first dummy line and a second dummy line connected to each other, alternatively, it may include a first, second, and third dummy lines connected to each other, or it may include a first, second, and fourth dummy lines connected to each other, or it may include a first, second, third, and fourth dummy lines connected to each other.

In an exemplary embodiment, the bezel region 300 may at least include bezel power supply lead lines (not shown) to which multiple fanout lines 80 are connected.

In an exemplary embodiment, the display region 100 may have a center line O, the first region 110 and the second region 120 in the display region 100 may be symmetrically disposed with respect to the center line O, and the multiple data signal lines 60, the multiple data fanout lines 70, the multiple dummy lines 80 and the multiple lead lines 90 in the lead line region 201 in the display region 100 may be symmetrically disposed with respect to the center line O.

In an exemplary embodiment, the orthographic projection of the second fanout line on the display substrate plane and the orthographic projection of the data signal line on the display substrate plane do not overlap.

In an exemplary embodiment, the orthographic projection of the first fanout line on the plane of the display substrate at least partially overlaps the orthographic projection of the initial signal line 31 on the plane of the display substrate.

In an exemplary embodiment, the display substrate may include a first insulating layer, a semiconductor layer, a second insulating layer, a first conductive layer, a third insulating layer, a second conductive layer, a fourth insulating layer, a third conductive layer and a fourth insulating layer sequentially arranged on the base substrate. The data signal line 60 may be disposed in the third conductive layer, and the data fanout line 70 and the dummy line 80 may be disposed in the fourth conductive layer.

In the exemplary embodiment, the present exemplary embodiment shows that the preparation process of the substrate is substantially the same as that of the foregoing embodiments and will not be repeated here.

Exemplary embodiments of the present disclosure provide a display substrate. Not only can the technical effect of the foregoing embodiment be realized, in addition, by the one in one insertion layout manner, and by arranging the overlap via in the same unit row, the extension length of the data fanout line can be effectively reduced, the load of the data fanout line can be effectively reduced, and the flatness of the planarization layer can be improved.

The aforementioned structure shown in the present disclosure and the preparation process thereof are merely exemplary description. In an exemplary embodiment, corresponding structures may be changed and patterning processes may be added or reduced according to actual needs, which is not limited here in the present disclosure.

In an exemplary implementation, the display substrate of the present disclosure may be applied to other display devices having pixel drive circuits, such as quantum dot displays and the like, which is not limited in the present disclosure.

The present disclosure further provides a preparation method for a display substrate, for preparing the display substrate according to the foregoing embodiments. In an exemplary embodiment, the display substrate includes a display region and a bonding region, the display region is provided with multiple data signal lines and multiple data fanout lines arranged along a first direction, the data signal lines extend along a second direction, the bonding region is located on a side of the second direction of the display region, and is provided with multiple lead lines, wherein the first direction and the second direction intersect; the preparation method may include:

forming the data signal line, the data fanout line and the lead line; a first terminal of the data fanout line is connected with the lead line, a second terminal of the data fanout line is connected with the data signal line, at least one data fanout line includes multiple fanout step sub-lines connected in sequence, at least one fanout step sub-line at least includes a first fanout line and a second fanout line connected with each other, wherein the first fanout line has a line shape extending along the first direction or the opposite direction of the first direction, and the second fanout line has a line shape extending along the second direction.

The present disclosure further provides a display apparatus which includes the aforementioned display substrate. The display apparatus may be any product or component with a display function, such as a mobile phone, a tablet computer, a television, a display, a laptop computer, a digital photo bezel, or a navigator, and the embodiments of the present invention are not limited thereto.

Although the implementations disclosed in the present disclosure are described as above, the described contents are only implementations which are used for facilitating the understanding of the present disclosure, but are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display substrate, comprising a display region and a bonding region, the display region provided with a plurality of data signal lines and a plurality of data fanout lines arranged along a first direction, the data signal lines extending along a second direction, the bonding region located on a side of the second direction of the display region, and provided with a plurality of lead lines, wherein the first direction and the second direction intersect; a first terminal of at least one data fanout line of the plurality of data fanout lines is connected with the lead line, a second terminal of the data fanout line is connected with at least one data signal line of the plurality of data signal lines, at least one data fanout line comprises a plurality of fanout step sub-lines connected in sequence, at least one fanout step sub-line at least comprises a first fanout line and a second fanout line connected with each other, wherein the first fanout line has a line shape extending along the first direction or an opposite direction of the first direction, and the second fanout line has a line shape extending along the second direction, wherein at least one fanout step sub-line further comprises a third fanout line and a fourth fanout line, a first terminal of the third fanout line is connected with an adjacent fanout step sub-line in an opposite direction of the second direction, after a second terminal of the third fanout line extends along a third direction, the second terminal of the third fanout line is connected to a first terminal of the first fanout line, after a second terminal of the first fanout line extends along the first direction or the opposite direction of the first direction, the second terminal of the first fanout line is connected to a first terminal of the fourth fanout line, after a second terminal of the fourth fanout line extends along a fourth direction, the second terminal of the fourth fanout line is connected to a first terminal of the second fanout line, after a second terminal of the second fanout line extends along the second direction, the second terminal of the second fanout line is connected to the first terminal of the third fanout line in adjacent fanout step sub-lines in the second direction; there is a first included angle between the third direction and the first direction, and the first included angle is greater than 0° and less than 90°, there is a second included angle between the fourth direction and the first direction, and the second included angle is greater than 0° and less than 90°, and wherein at least one fanout connection block is further provided on the at least one of the fanout step sub-lines, and the fanout connection block is configured to be connected to the data signal line; the fanout connection block is rectangular; the fanout connection block is disposed at the third fanout line extending along the third direction which is not perpendicular to the second direction along which the data signal lines are extended; or the fanout connection block is disposed at the fourth fanout line extending along the fourth direction which is not perpendicular to the second direction along which the data signal lines are extended.

2. The display substrate according to claim 1, wherein in at least one fanout step sub-line, a first terminal of the first fanout line is connected with an adjacent fanout step sub-line in an opposite direction of the second direction, after a second terminal of the first fanout line extends along the first direction or the opposite direction of the first direction, the second terminal of the first fanout line is connected with a first terminal of the second fanout line, after the second terminal of the second fanout line extends along the second direction, the second terminal of the second fanout line is connected with the first terminal of the first fanout line in adjacent fanout step sub-lines in the second direction.

3. The display substrate according to claim 1, wherein at least one fanout step sub-line further comprises a third fanout line, a first terminal of the third fanout line is connected with an adjacent fanout step sub-line in an opposite direction of the second direction, after a second terminal of the third fanout line extends along the third direction, the second terminal of the third fanout line is connected with a first terminal of the first fanout line, after a second terminal of the first fanout line extends along the first direction or the opposite direction of the first direction, the second terminal of the first fanout line is connected with a first terminal of the second fanout line, after a second terminal of the second fanout line extends along the second direction, the second terminal of the second fanout line is connected with the first terminal of the third fanout line in adjacent fanout step sub-lines in the second direction; there is a first included angle between the third direction and the first direction, and the first included angle is greater than 0° and less than 90°.

4. The display substrate according to claim 1, wherein at least one fanout step sub-line further comprises a fourth fanout line, a first terminal of the first fanout line is connected to an adjacent fanout step sub-line in an opposite direction to the second direction, after a second terminal of the first fanout line extends along the first direction or the opposite direction of the first direction, the second terminal of the first fanout line is connected to a first terminal of the fourth fanout line, after a second terminal of the fourth fanout line extends along the fourth direction, the second terminal of the fourth fanout line is connected to a first terminal of the second fanout line, after a second terminal of the second fanout line extends along the second direction, the second terminal of the second fanout line is connected to the first terminal of the first fanout line in adjacent fanout step sub-lines in the second direction; there is a second included angle between the fourth direction and the first direction, and the second included angle is greater than 0° and less than 90°.

5. The display substrate according to claim 1, wherein the first included angle is 30° to 60°, and the second included angle is 30° to 60°.

6. The display substrate according to claim 1, wherein two second fanout lines are provided between adjacent data signal lines in the first direction, wherein the data fanout line is connected with the data signal line through an overlap via, orthographic projections of a plurality of overlap vias on a plane of the display substrate at least partially overlaps with a orthographic projection of a first overlap via line on the plane of the display substrate, there is an overlap included angle between the first overlap via line and the first direction, and the overlap included angle is greater than 0° and less than 90°.

7. The display substrate according to claim 1, wherein one second fanout line is provided between adjacent data signal lines in the first direction.

8. The display substrate according to claim 7, wherein the data fanout line is connected to the data signal line through an overlap via, orthographic projections of a plurality of overlap vias on a base substrate at least partially overlap with an orthographic projection of a second overlap via line on the base substrate, and the second overlap via line is a straight line extending along the first direction.

9. The display substrate according to claim 1, wherein an orthographic projection of the second fanout line on a plane of the display substrate and an orthographic projection of the data signal line on the plane of the display substrate do not overlap.

10. The display substrate according to claim 1, wherein the display region is further provided with an initial signal line extending along the first direction, and an orthographic projection of the first fanout line on a plane of the display substrate at least partially overlaps with an orthographic projection of the initial signal line on the plane of the display substrate.

11. The display substrate according to claim 1, wherein the display region is further provided with a plurality of dummy lines, and a step-like routing of the dummy lines and a step-like routing of the data fanout lines may be substantially the same.

12. The display substrate according to claim 11, wherein the display region at least comprises a first region and a second region, wherein the first region is provided with the data fanout line, the second region is provided with the dummy line, and at least one dummy line comprises a plurality of dummy step sub-lines connected sequentially.

13. The display substrate according to claim 12, wherein the first region comprises a plurality of first circuit units, at least one first circuit unit is provided with a fanout step sub-line, the second region comprises a plurality of second circuit units, at least one second circuit unit is provided with a dummy step sub-line, and a position and shape of the fanout step sub-line in the first circuit unit is substantially the same as a position and shape of the dummy step sub-line in the second circuit unit.

14. The display substrate according to claim 13, wherein at least one first circuit unit is provided with an overlap via through which the data fanout line is connected to the data signal line.

15. The display substrate according to claim 13, wherein at least one second circuit unit is provided with a break, which is configured to isolate the data fanout line from the dummy line.

16. The display substrate according to claim 13, wherein the at least one fanout connection block is configured to be connected to the data signal line through an overlap via.

17. The display substrate according to claim 16, wherein at least one second circuit unit is provided with a dummy connection block, and a position and shape of the dummy connection block in the second circuit unit are substantially the same as a position and shape of the fanout connection block in the first circuit unit.

18. The display substrate according to claim 11, wherein the display substrate further comprises a bezel region located on other sides of the display region, the bezel region at least comprises a bezel power supply lead line, the fanout line is connected with the bezel power supply lead line, and the bezel power supply lead line is configured to transmit high-voltage power supply signals or low-voltage power supply signals.

19. A display apparatus, comprising the display substrate according to claim 1.

* * * * *